(12) United States Patent
Mohapatra et al.

(10) Patent No.: US 10,471,913 B2
(45) Date of Patent: Nov. 12, 2019

(54) LOAD-BEARING PARTS WITH NETWORKS OF INTERCONNECTING BRANCHES AND METHODS OF MAKING THE SAME

(71) Applicant: SABIC Global Technologies B.V., Bergen op Zoom (NL)

(72) Inventors: Subhransu S. Mohapatra, Bangalore (IN); Poornesh Shivakumar, Bangalore (KR)

(73) Assignee: SABIC Global Technologies B.V., Bergen op Zoom (NL)

(*) Notice: Subject to any disclaimer, the term of this patent is extended or adjusted under 35 U.S.C. 154(b) by 32 days.

(21) Appl. No.: 15/764,369

(22) PCT Filed: Sep. 28, 2016

(86) PCT No.: PCT/IB2016/055801
§ 371 (c)(1),
(2) Date: Mar. 29, 2018

(87) PCT Pub. No.: WO2017/056016
PCT Pub. Date: Apr. 6, 2017

(65) Prior Publication Data
US 2018/0272970 A1 Sep. 27, 2018

(30) Foreign Application Priority Data
Sep. 30, 2015 (IN) .......................... 3118/DEL/2015

(51) Int. Cl.
| | |
|---|---|
| *B60R 19/30* | (2006.01) |
| *B60R 19/26* | (2006.01) |
| *G06F 17/50* | (2006.01) |
| *B33Y 10/00* | (2015.01) |
| *B33Y 50/02* | (2015.01) |
| *B33Y 80/00* | (2015.01) |
(Continued)

(52) U.S. Cl.
CPC .............. *B60R 19/30* (2013.01); *B60R 19/26* (2013.01); *G06F 17/5095* (2013.01);
(Continued)

(58) Field of Classification Search
CPC ...... B60R 19/30; B60R 19/26; G06F 17/5095
(Continued)

(56) References Cited

U.S. PATENT DOCUMENTS

| | | |
|---|---|---|
| 2,845,144 A | 7/1958 | Bohn |
| 8,126,684 B2 | 2/2012 | Goel et al. |
(Continued)

FOREIGN PATENT DOCUMENTS

| | | |
|---|---|---|
| CN | 102663212 A | 9/2012 |
| CN | 103318260 A | 9/2013 |
(Continued)

OTHER PUBLICATIONS

ALTAIR HyperWorks; OptiStruct Brochure, Altair Engineering Inc., 2014, www.altairhyperworks.com.

*Primary Examiner* — Pinel E Romain
(74) *Attorney, Agent, or Firm* — BakerHostetler

(57) ABSTRACT

In one example, a load-bearing, three-dimensional printed part resists a load. The load-bearing part has a load-receiving member, a support member, and a network of interconnected branches. The load-receiving member has an outer surface that receives the load. The support member is offset from the load-receiving member along a first direction. The network of interconnected branches extends from the load-receiving member to the support member, and includes a first primary branch and an auxiliary branch. The first primary branch has a first primary-branch end attached to one of the load-receiving member and the support member. The auxiliary branch has a first auxiliary-branch end attached to the first primary branch, and a second auxiliary-branch end attacked to one of (i) the load-receiving member, (ii) the support member, and (iii) a second primary branch.

18 Claims, 8 Drawing Sheets

(51) Int. Cl.
  *B29C 64/393*   (2017.01)
  *B29C 64/10*    (2017.01)
  *B29K 55/02*    (2006.01)
  *B29K 79/00*    (2006.01)
  *B29L 31/30*    (2006.01)

(52) U.S. Cl.
  CPC ............ *B29C 64/10* (2017.08); *B29C 64/393* (2017.08); *B29K 2055/02* (2013.01); *B29K 2079/085* (2013.01); *B29L 2031/3044* (2013.01); *B33Y 10/00* (2014.12); *B33Y 50/02* (2014.12); *B33Y 80/00* (2014.12); *B60R 2019/264* (2013.01)

(58) Field of Classification Search
  USPC ......................................................... 293/133
  See application file for complete search history.

(56) References Cited

U.S. PATENT DOCUMENTS

| | | | | |
|---|---|---|---|---|
| 8,596,711 | B2 | 12/2013 | Yasui | |
| 9,393,923 | B2 * | 7/2016 | Handing | B60R 19/34 |
| 9,399,438 | B2 * | 7/2016 | Braunbeck | B60R 19/04 |
| 9,415,735 | B1 * | 8/2016 | Baccouche | B60R 19/34 |
| 9,925,937 | B2 * | 3/2018 | Watanabe | B60R 19/24 |
| 2004/0195862 | A1 | 10/2004 | Saeki | |
| 2012/0086225 | A1 * | 4/2012 | Matsuura | B60R 19/34 293/132 |
| 2012/0248819 | A1 * | 10/2012 | Okamura | B60R 19/12 296/187.1 |
| 2012/0248820 | A1 | 10/2012 | Yasui et al. | |
| 2014/0091585 | A1 * | 4/2014 | Ramoutar | B60R 19/24 293/133 |
| 2014/0214370 | A1 | 7/2014 | Olhofer et al. | |
| 2014/0277669 | A1 | 9/2014 | Nardi et al. | |
| 2014/0363481 | A1 | 12/2014 | Pasini et al. | |
| 2015/0274209 | A1 * | 10/2015 | Basappa | B60R 19/26 180/271 |
| 2018/0178742 | A1 * | 6/2018 | Hojo | B60R 19/34 |

FOREIGN PATENT DOCUMENTS

| | | |
|---|---|---|
| CN | 104462725 A | 3/2015 |
| DE | 202014009810 U1 | 8/2015 |
| JP | 2004-066932 A | 3/2004 |

* cited by examiner

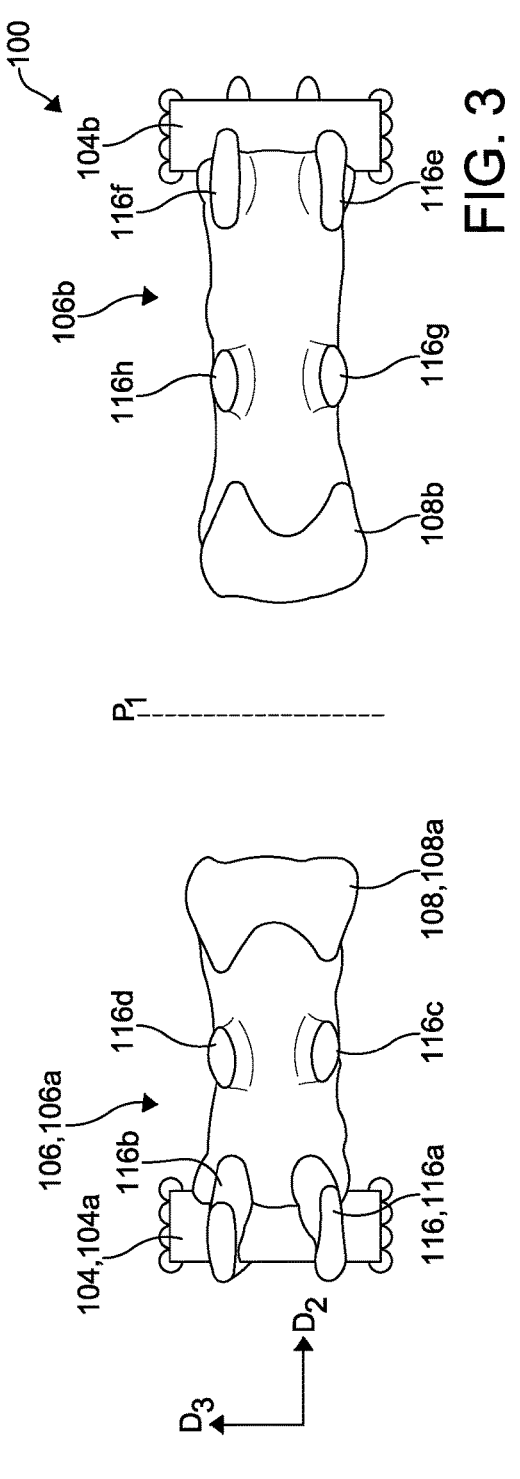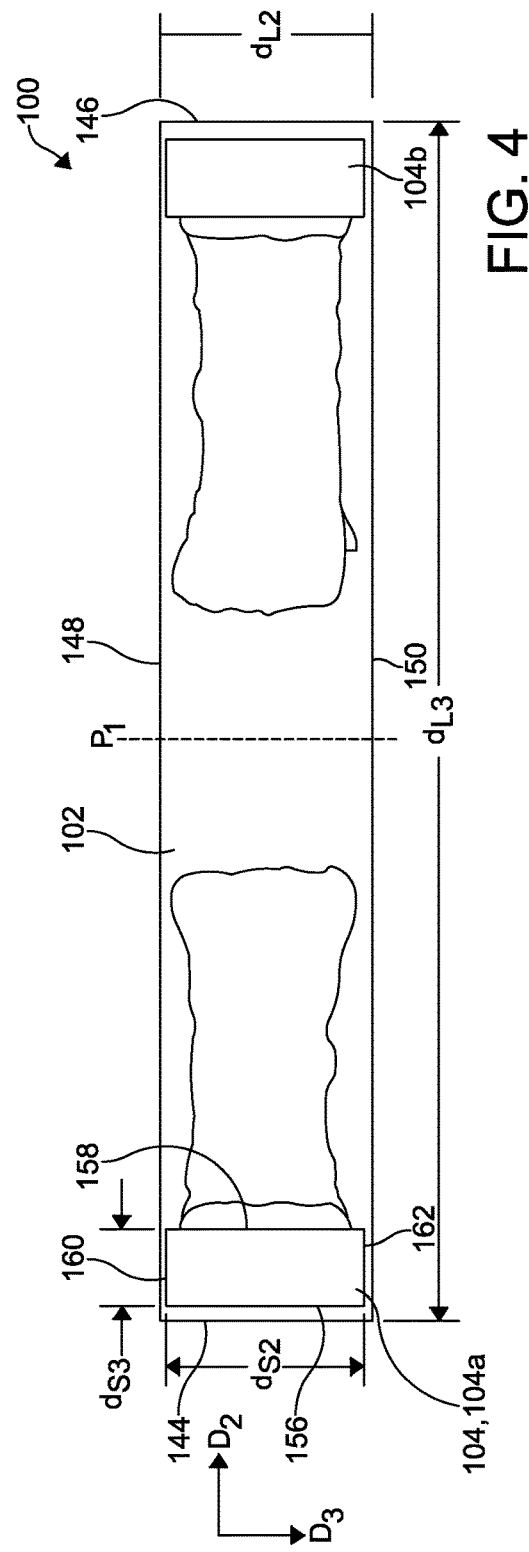

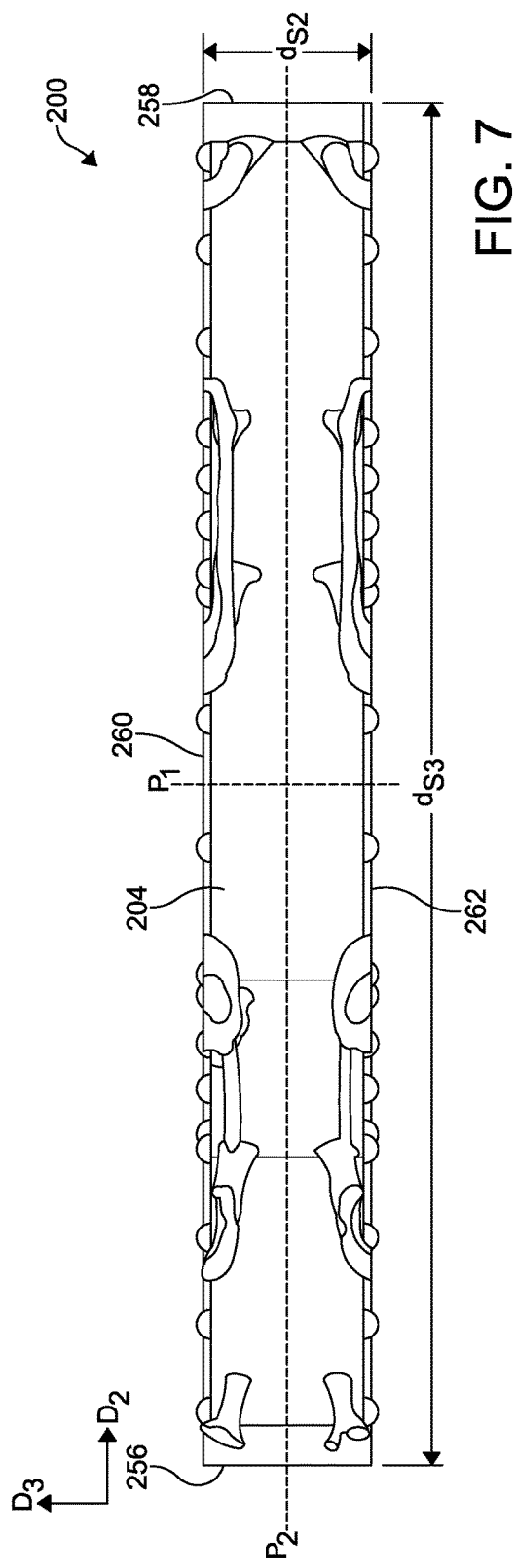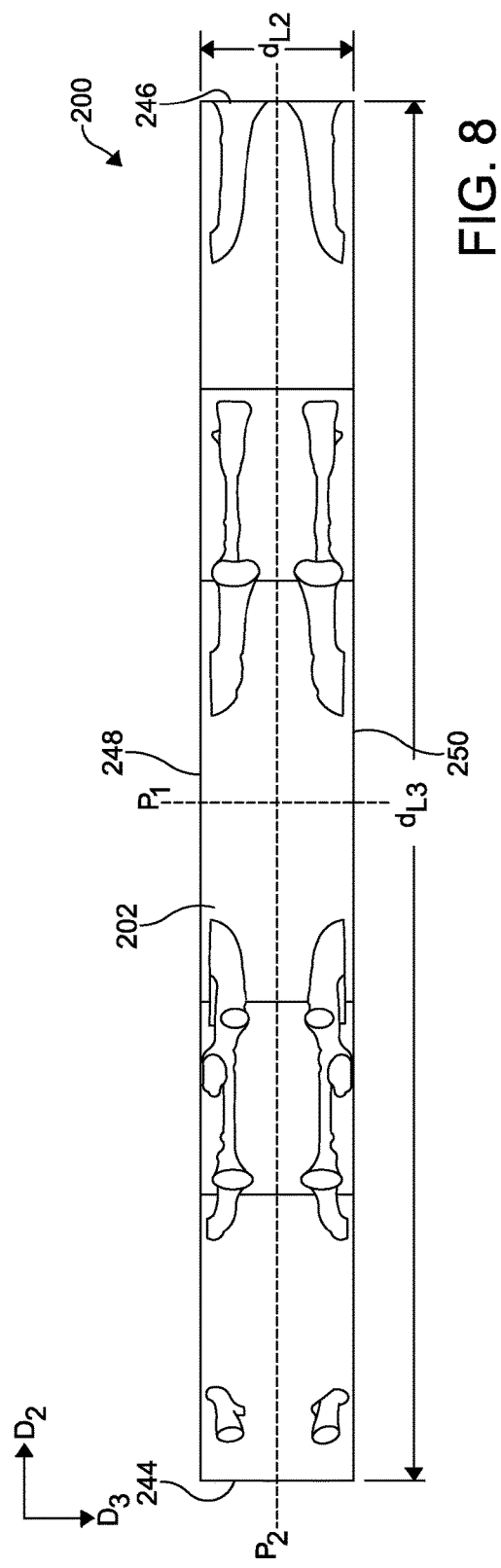

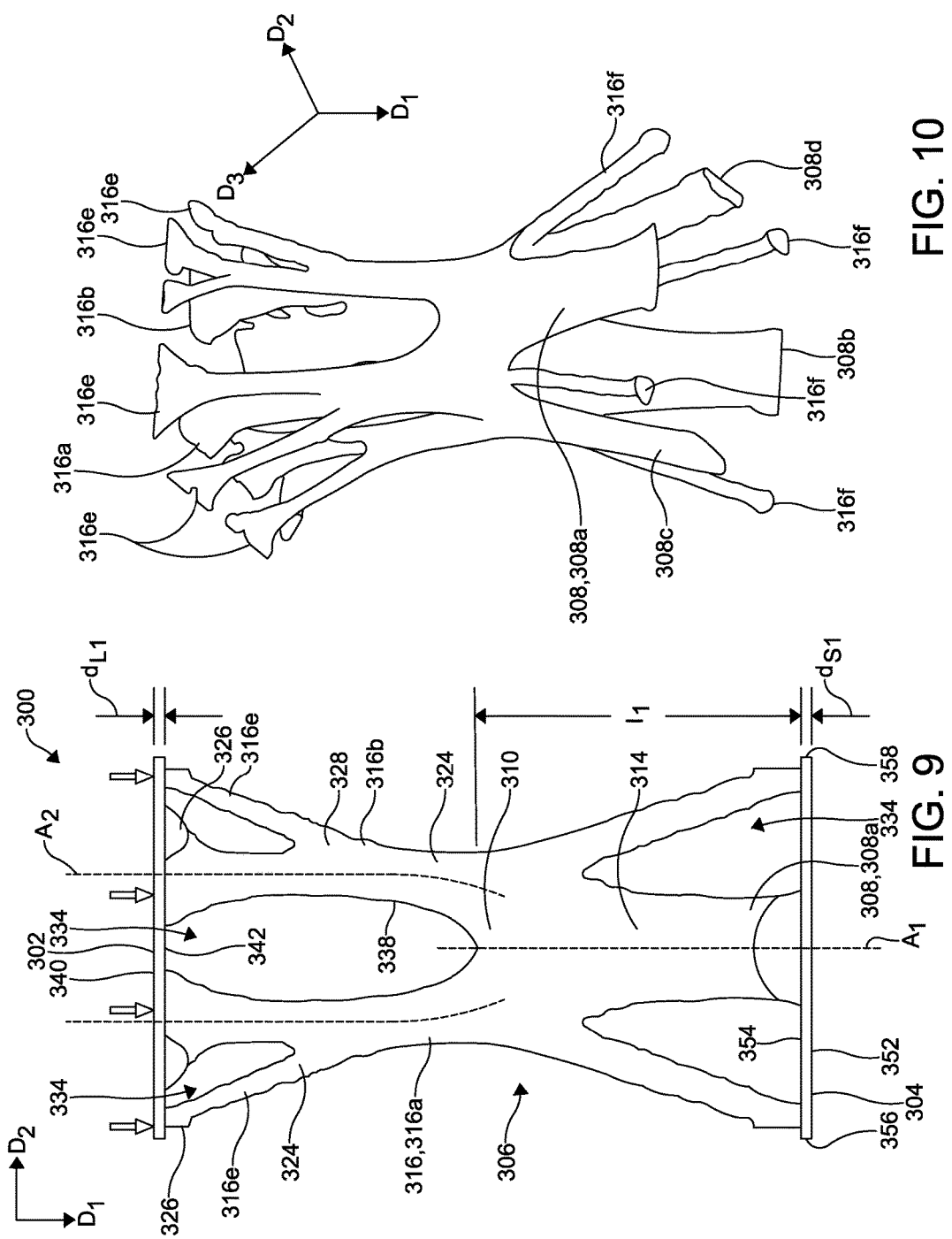

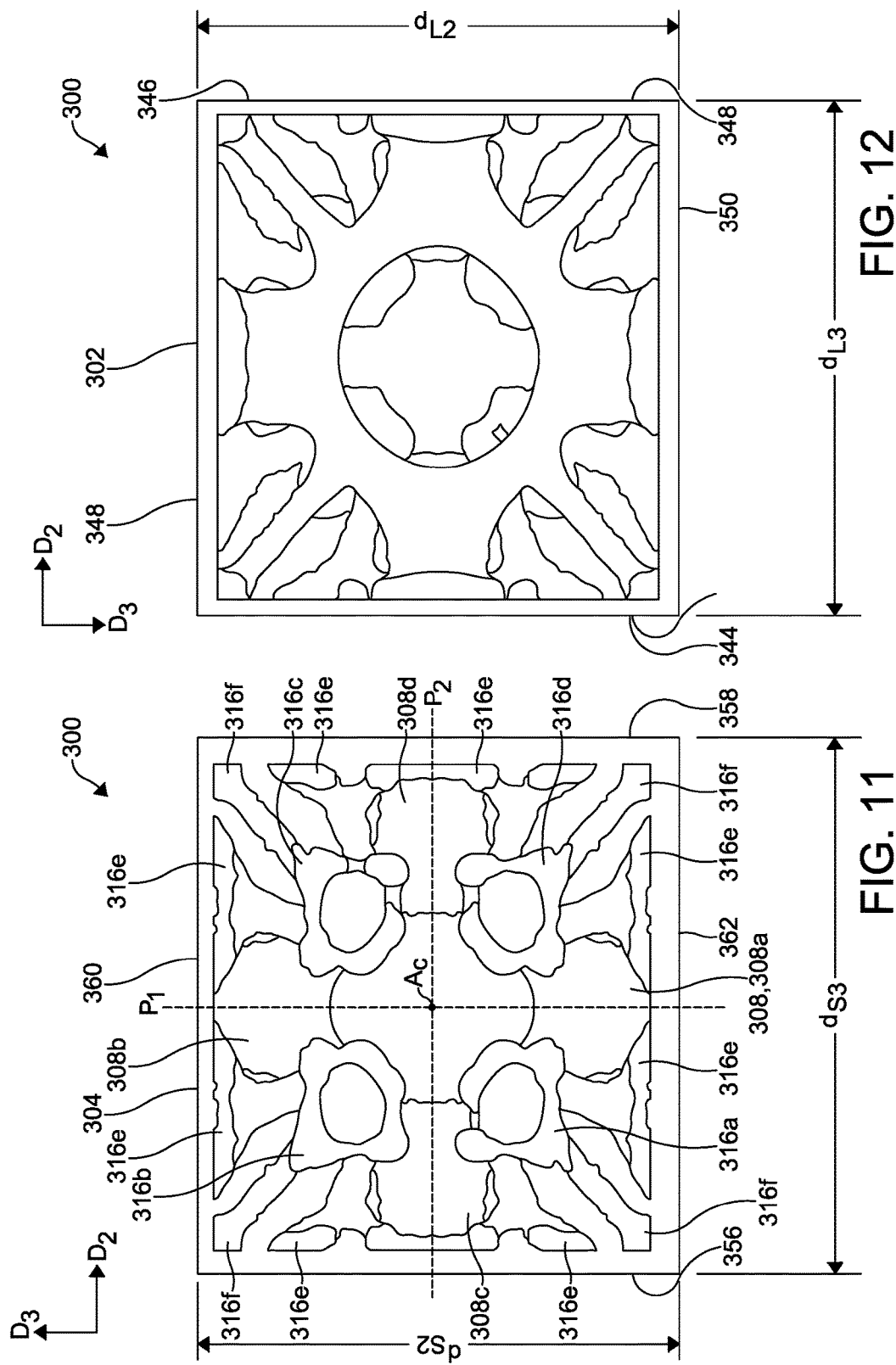

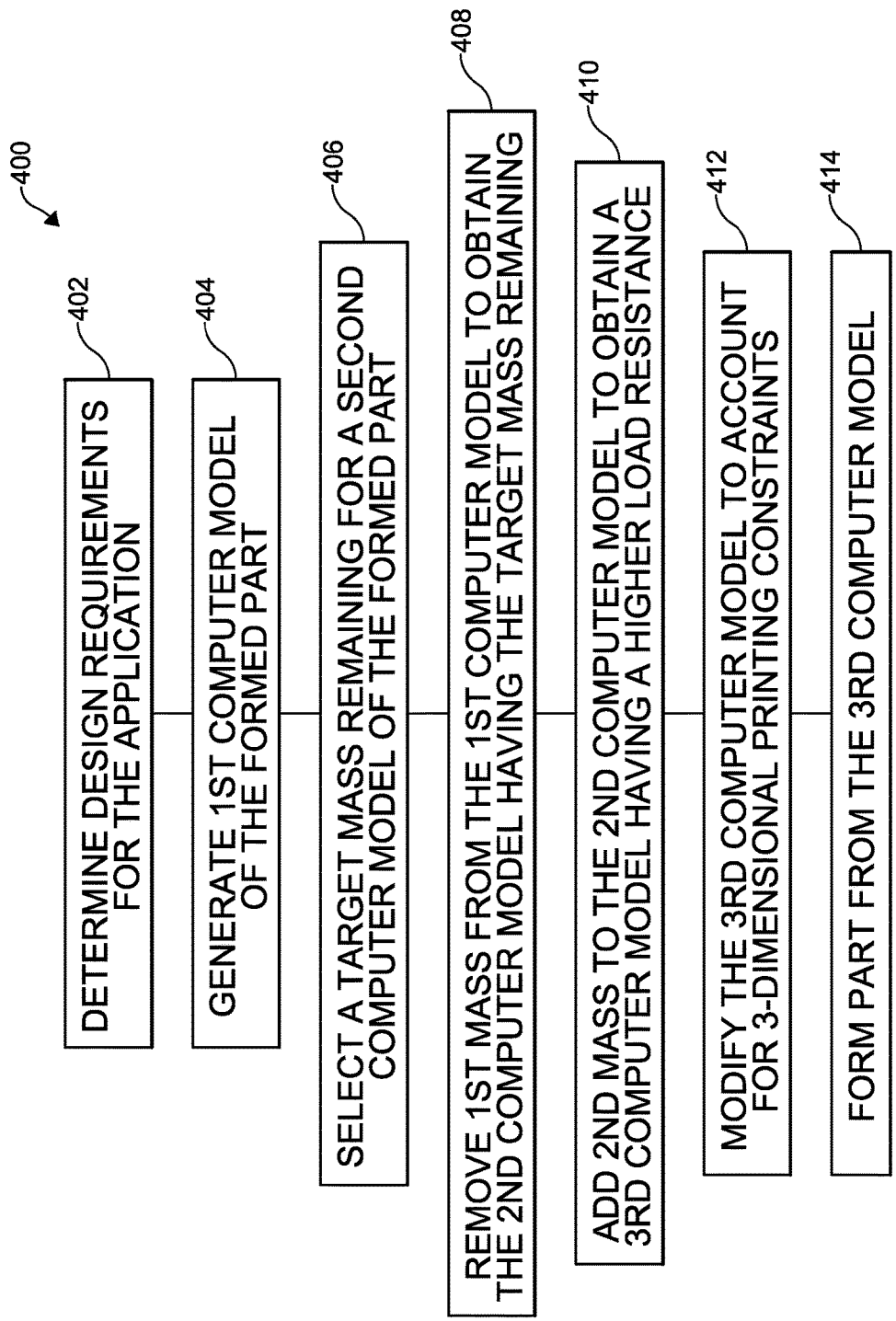

LOAD-BEARING PARTS WITH NETWORKS OF INTERCONNECTING BRANCHES AND METHODS OF MAKING THE SAME

CROSS REFERENCE TO RELATED APPLICATIONS

This application is the National Stage of International Application No. PCT/IB2016/055801 filed Sep. 28, 2016, which claims the benefit of Indian Provisional Application No. 3118/DEL/2015 filed Sep. 30, 2015, the disclosures of which are incorporated herein by this reference in their entireties.

TECHNICAL FIELD

This document pertains generally, but not by way of limitation, to load-bearing parts and methods of making the same.

BACKGROUND

Load-bearing parts can be designed using software that generates computer models of the load-bearing parts. The computer models can be analyzed to predict whether load-bearing parts made based on the computer models will meet load requirements.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 3 shows a top view of the load-bearing part of FIG. 1 with the load-receiving member removed;

FIG. 4 shows a bottom view of the load-bearing part of FIG. 1;

FIG. 7 shows a top view of the load-bearing part of FIG. 5 with the load-receiving member removed;

FIG. 8 shows a bottom view of the load-bearing part of FIG. 5 with the support member removed;

FIG. 9 shows a side view of a load-bearing part according to another example having a load-receiving member, a support member, and a network of interconnected branches;

FIG. 10 shows a perspective view of the network of interconnected branches of the load-bearing part of FIG. 9;

FIG. 11 shows a top view of the load-bearing part of FIG. 9 with the load-receiving member removed;

FIG. 12 shows a bottom view of the load-bearing part of FIG. 9 with the support member removed;

FIG. 13 shows a simplified block diagram of a method of designing a load-bearing part according to one example.

DETAILED DESCRIPTION

Figure 1:
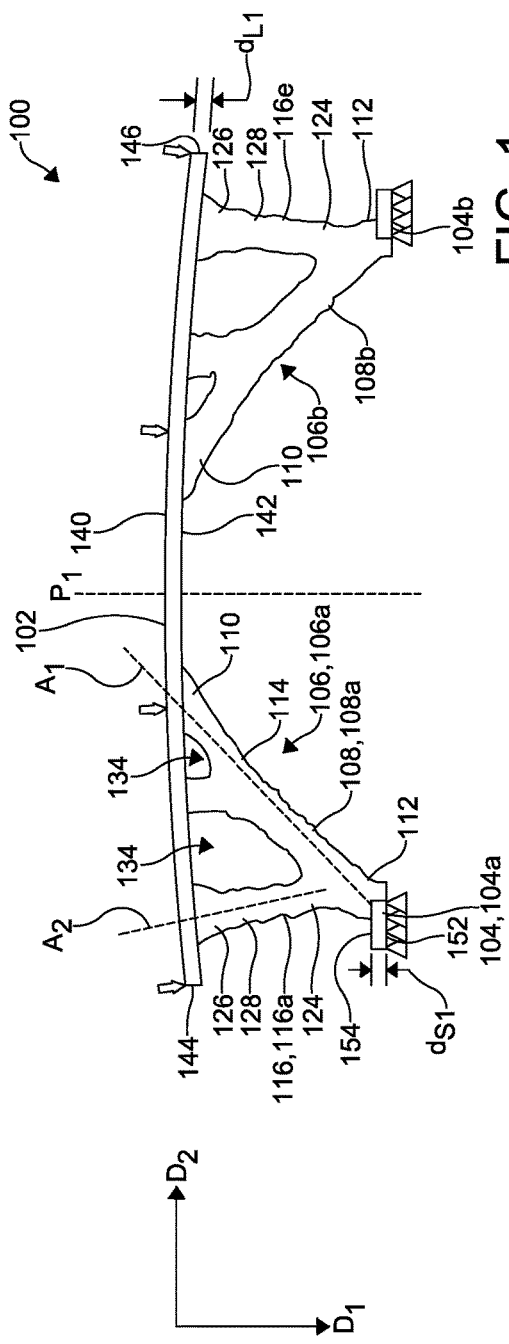
FIG. 1 shows a side view of a load-bearing part according to one example having a load-receiving member, two support members, and two networks of interconnected branches.
Figure 2:
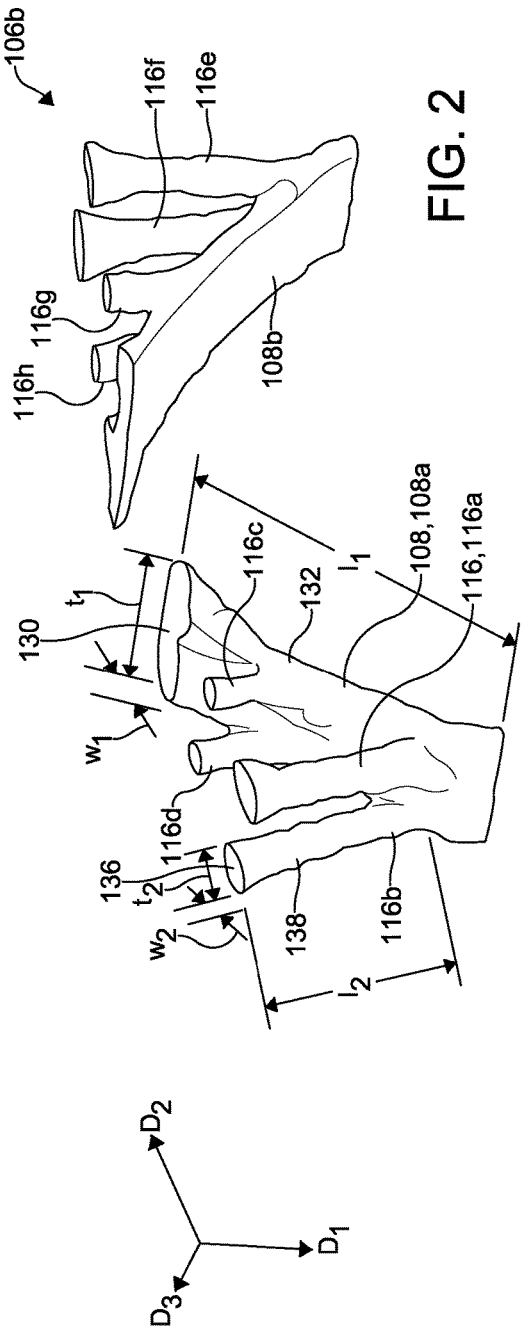
FIG. 2 shows a perspective view of the two networks of interconnected branches of the load-bearing part of FIG. 1.
Figure 5:
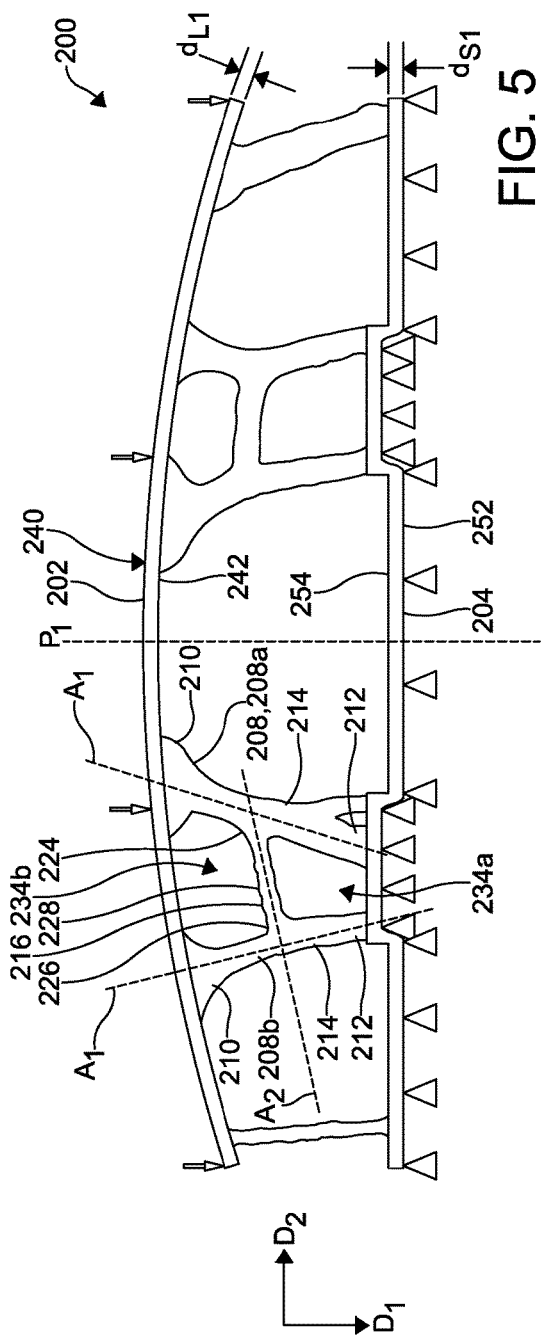
FIG. 5 shows a side view of a load-bearing part according to another example having a load-receiving member, a support member, and a plurality of networks of interconnected branches.
Figure 6:
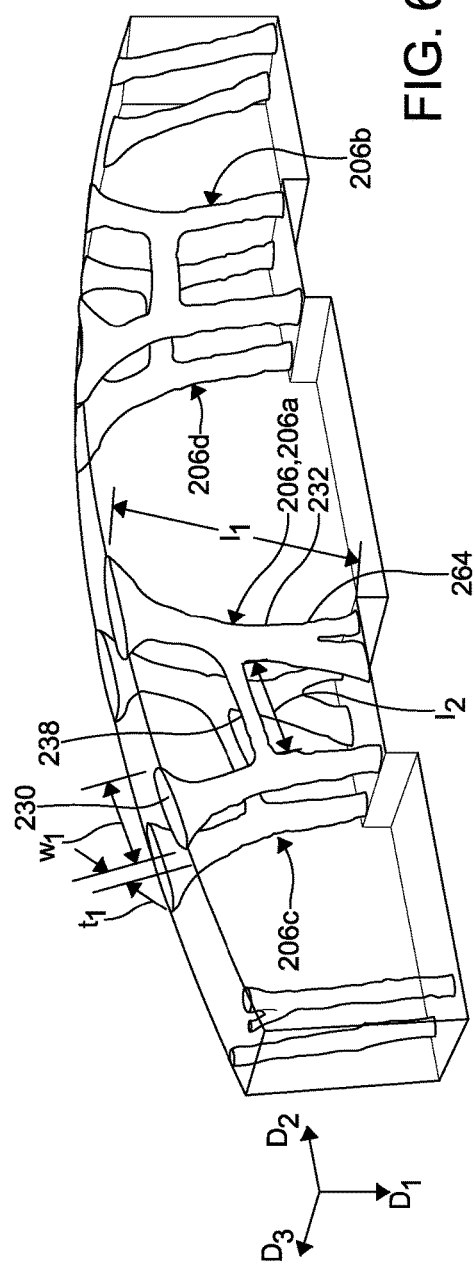
FIG. 6 shows a perspective view of the plurality of networks of interconnected branches of the load-bearing part of FIG. 5.

The present document relates to load-bearing parts having at least one network of interconnected branches and methods of making the same. The load-bearing parts may vary in shape and size and may be used in a wide variety of applications, including, but not limited to vehicle bumpers. FIGS. 1-12 show examples of load-bearing parts 100, 200, and 300 for a vehicle bumper. However, it will be understood that load-bearing parts of this disclosure are not limited to the examples of FIGS. 1-12, or to parts for a vehicle bumper for that matter. Each load-bearing part 100, 200, and 300 has a load-receiving member (102, 202, 302), at least one support member (104, 204, 304) and at least one network of interconnected branches (106, 206, 306) that interconnects the at least one load-receiving member (102, 202, 302) and the at least one support member (104, 204, 304). Each of the at least one support member (104, 204, 304) is offset from its corresponding load-receiving member (102, 202, 302) along a first direction $D_1$.

Each load-receiving member (102, 202, 302) has an outer surface (140, 240, 340) configured to receive a load, and can have an inner surface (142, 242, 342), opposite the outer surface (140, 240, 340). Each inner surface (142, 242, 342) can be connected to its at least one corresponding network (106, 206, 306) of interconnected branches such that the at least one corresponding network (106, 206, 306) extends from the inner surface (142, 242, 342) to the corresponding at least one support member (104, 204, 304). Each load-receiving member (102, 202, and 302) can be a plate as shown, or have another suitable shape. Each plate can have a first end (144, 244, 344) and an opposed second end (146, 246, 346) that each extend from its outer surface (140, 240, 340) to its inner surface (142, 242, 342). Further, each plate can have a first side (148, 248, 348) and an opposed second side (150, 250, 350) that each extend from its outer surface (140, 240, 340) to its inner surface (142, 242, 342) and from its first end (144, 244, 344) to its second end (146, 246, 346). Each load-receiving member (102, 202, 302) has a first load-receiving member dimension $d_{L1}$ from its outer surface (140, 240, 340) to its inner surface (142, 242, 342), a second load-receiving member dimension $d_{L2}$ from its first side (148, 248, 348) to its second side (150, 250, 350), and a third load-receiving member dimension $d_{L3}$ from its first end (144, 244, 344) to its second end (146, 246, 346). The second load-receiving member dimension $d_{L2}$ can be greater than, less than, or substantially equal to the third load-receiving member dimension $d_{L3}$, and the second and third load-receiving member dimensions $D_{L2}$ and $D_{L3}$ are greater than the first load-receiving member dimension $d_{L1}$.

The outer surface (140, 240, 340) of each load-receiving member (102, 202, 302) can define a plurality of discrete loading points (indicted by arrows) that are spaced from one another along the outer surface (140, 240, 340) and are configured to receive a load perpendicular to the outer surface (140, 240, 340). Alternatively, each load-receiving member (102, 202, 302) can define a continuous load-contact area, as opposed to discrete loading points. Each network (106, 206, 306) of interconnected branches forms a load pathway configured to resist the load, wherein the load pathway extends from the corresponding load-receiving member (102, 202, 302) at a respective one of the discrete loading points to the corresponding support member (104a, 204, 304) via the branches of the network. In some embodiments, the outer surface (140, 240, 340) can be solid as it extends from the first end (144, 244, 344) to the second end (146, 246, 346) and from the first side (148, 248, 348) to the second side (150, 250, 350). In alternative embodiments, the outer surface can define at least one, such as a plurality, of holes that extend through the outer surface and between respective ones of the branches of the plurality of branches.

Each of the at least one support member (104, 204, 304) defines a support-member outer surface (152, 252, 352) configured to react to the load, and can further define a support-member inner surface (154, 254, 354), opposite the support-member outer surface (152, 252, 352). The support-member inner surface (154, 254, 354) can be connected to at least one corresponding network (106, 206, 306) of interconnected branches such that the at least one corresponding network (106, 206, 306) extends from the at least one support-member inner surface (154, 254, 354) to the load-receiving member (102, 202, 302). Each of the at least one support member (104, 204, 304) can be a plate as shown or have any other suitable shape. Each plate has a support-member first end (156, 256, 356) and an opposed support member second end (158, 258, 358) that each extend from its support-member outer surface (152, 252, 352) to its support-member inner surface (154, 254, 354). Further, each plate has a first side (160, 260, 360) and a second side (162, 262, 362) that each extend from its support-member outer surface (152, 252, 352) to its support-member inner surface (154, 254, 354) and from its support-member first end (156, 256, 356) to its support-member second end (158, 258, 358).

Each of the at least one support member (104, 204, 304) has a first support-member dimension $d_{S1}$ from its support-member outer surface (152, 252, 352) to its support-member inner surface (154, 254, 354), a second support-member dimension $d_{S2}$ from its support-member first side (160, 260, 360) to its support-member second side (162, 262, 362), and a third support-member dimension $d_{S3}$ from its support-member first end (156, 256, 356) to its support-member second end (158, 258, 358). The second support-member dimension $d_{S2}$ can be greater than, less than, or substantially equal to the third support-member dimension $d_{S3}$. The second and third support-member dimensions $d_{S2}$ and $d_{S3}$ can be greater than the first support-member dimension $d_{S1}$. In some embodiments, the outer surface (152, 252, 352) can be solid as it extends from its first end (156, 256, 356) to its second end (158, 258, 358) and from its first side (160, 260, 360) to its second side (162, 262, 362). In alternative embodiments, the outer surface (152, 252, 352) can define at least one, such as a plurality, of holes that extend through the outer surface (152, 252, 352).

Each of the at least one network (106, 206, 306) extends from a load-receiving member (102, 202, 302) to a support member (104, 204, 304). Further, each of the at least one network (106, 206, 306) has at least one primary branch (108, 208, 308) and at least one auxiliary branch (116, 216, 316). Each of the at least one network (106, 206, 306) can be a monolithic part formed from a single material such as, without limitation, acrylonitrile butadiene styrene (ABS) or ULTEM®. Further, each of the at least one network (106, 206, 306) can be formed with one or both of its corresponding load-receiving members (102, 202, 204) and its at least one corresponding support members (104, 204, 304) as a single monolithic part of a single such material. Each load-bearing part (100, 200, 300), or individual parts thereof such as the at least one network (106, 206, 306) can be formed by additive manufacturing, such as three-dimensional printing, or by any other suitable manufacturing method such as injection molding.

Each of the at least one primary branches (108, 208, 308) has a first primary-branch end (110, 210, 310), a second primary-branch end (112, 212, 312), and a primary-branch body (114, 214, 314) extending from the first primary-branch end (110, 210, 310) to the second primary-branch end (112, 212, 312). Each primary-branch body (114, 214, 314) is elongate as it extends from the first primary-branch end (110, 210, 310) to the second primary-branch end (112, 212, 312) along a primary-branch axis of elongation A1. Each primary-branch body (114, 214, 314) can be straight or curved as it extends from its first primary-branch end (110, 210, 310) to its second primary-branch end (112, 212, 312) along its primary-branch axis of elongation A1. Each primary-branch body (114, 214, 314) defines a maximum length $l_1$ along the axis of elongation $A_1$, a maximum width $w_1$ in a select direction perpendicular to its axis of elongation $A_1$, and a maximum thickness $t_1$ in a second select direction, perpendicular to both the axis of elongation and the first select direction, the maximum length $l_1$ being greater than the maximum width $w_1$ and the maximum thickness $t_1$.

Further, each primary-branch body (114, 214, 314) can define a plurality of primary-branch cross-sectional planes (130, 230, 330) along its primary-branch axis of elongation $A_1$. The plurality of primary-branch cross-sectional planes (130, 230, 330) are perpendicular to the primary-branch axis of elongation $A_1$, and each primary-branch cross-sectional plane (130, 230, 330) can define a primary-branch cross-sectional area of its primary-branch body (114, 214, 314). The primary-branch cross-sectional areas of each primary-branch body (114, 214, 314) can vary as they extend from its first primary-branch end (110, 210, 310) to its second primary-branch end (112, 212, 312). For example, the primary-branch cross-sectional areas can decrease as they extend from the first primary-branch end (110, 210, 310) toward a middle of the primary-branch body (114, 214, 314) along its primary-branch axis of elongation $A_1$. Further, the primary-branch cross-sectional areas can decrease as they extend from the second primary-branch end (112, 212, 312) toward the middle of the primary-branch body (114, 214, 314) along its primary-branch axis of elongation $A_1$. Thus, the primary-branch cross-sectional areas can be smallest between the first primary-branch end (110, 210, 310) and the second primary-branch (112, 212, 312), such as near the middle of the primary-branch body (114, 214, 314).

Each primary-branch body (114, 214, 314) can have an outer surface (132, 232, 332) that extends from its first primary-branch end (110, 210, 310) to its second primary-branch end (112, 212, 312). Each outer surface (132, 232, 332) can define an outer perimeter of the primary-branch body (114, 214, 314) that is solid along an entirety of the primary-branch body (114, 214, 314). Thus, each outer surface (132, 232, 332) can be devoid of any holes extending through the outer surface (132, 232, 332).

Each of the at least one auxiliary branches (116, 216, 316) has a first auxiliary-branch end (124, 224, 324), a second auxiliary-branch end (126, 226, 326), and an auxiliary-branch body (128, 228, 328) that extends from the first auxiliary-branch end (124, 224, 324) to the second auxiliary-branch end (126, 226, 326). Each auxiliary-branch body (128, 228, 328) is elongate as it extends from its first auxiliary-branch end (124, 224, 324) to its second auxiliary-branch end (126, 226, 326) along an auxiliary-branch axis of elongation $A_2$. Each auxiliary-branch body (128, 228, 328) can be curved or straight as it extends from its first auxiliary-branch end (124, 224, 324) to its second auxiliary-branch end (126, 226, 326) along its auxiliary-branch axis of elongation $A_2$. Further, each auxiliary-branch body (128, 228, 328) defines a maximum length $l_2$ along its auxiliary-branch axis of elongation $A_2$, a maximum width $w_2$ in a first select direction perpendicular to its auxiliary-branch axis of elongation $A_2$, and a maximum thickness $t_2$ in a second select direction, perpendicular to both the auxiliary-branch axis of elongation $A_2$ and the first select direction. The maximum length $l_2$ of each auxiliary branch (116, 216, 316) is greater than both its maximum width $w_2$ and its maximum thickness $t_2$.

Each auxiliary-branch body (128, 228, 328) defines a plurality of cross-sectional planes (136, 236, 336) along its auxiliary-branch axis of elongation $A_2$, each being perpendicular to its auxiliary-branch axis of elongation $A_2$. The auxiliary-branch cross-sectional planes (136, 236, 336) of each auxiliary-branch body (128, 228, 328) each define an auxiliary-branch cross-sectional area, where the auxiliary-branch cross-sectional areas can vary as they extend from the first auxiliary-branch end (124, 224, 324) to the second auxiliary-branch end (126, 226, 326). For example, the auxiliary-branch cross-sectional areas for each auxiliary-branch body (128, 228, 328) can decrease as they extend from the first auxiliary-branch end (124, 224, 324) toward a middle of the auxiliary-branch body (128, 228, 328) along the auxiliary-branch axis of elongation $A_2$. Further, the auxiliary-branch cross-sectional areas for each auxiliary-branch body (128, 228, 328) can decrease as they extend from the second auxiliary-branch end (126, 226, 326) toward the middle of the auxiliary-branch body (128, 228, 328) along the auxiliary-branch axis of elongation $A_2$. Thus, the auxiliary-branch cross-sectional areas of each auxiliary-branch body (128, 228, 328) can be smallest between the first auxiliary-branch end (124, 224, 324) and the second auxiliary-branch end (126, 226, 326), such as near the middle of the auxiliary-branch body (128, 228, 328). Alternatively, the auxiliary-branch cross-sectional areas of each auxiliary-branch body (128, 228, 328) can be smallest near one of the first auxiliary-branch end (124, 224, 324) and the second auxiliary-branch end (126, 226, 326).

Each auxiliary-branch body (128, 228, 328) has an outer surface (138, 238, 338) that extends from its first auxiliary-branch end (124, 224, 324) to its second auxiliary-branch end (126, 226, 326). Each outer surface (138, 238, 338) can define an outer perimeter of its auxiliary-branch body (128, 228, 328) that is solid along an entirety of the auxiliary-branch body (128, 228, 328). Thus, each outer surface (138, 238, 338) can be devoid of any holes extending through the outer surface (138, 238, 338).

The primary-branch cross-sectional planes (130, 230, 330) of each of the at least one primary branch (108, 208, 308) can define a minimum cross-sectional area and a maximum cross-sectional area of the primary branch (108, 208, 308). Similarly, the auxiliary-branch cross-sectional planes (136, 236, 336) of each auxiliary branch (116, 216, 316) can define a minimum cross-sectional area and a maximum cross-sectional area of the auxiliary branch (116, 216, 316). The minimum cross-sectional area of each primary branch (108, 208, 308) in a network (106, 206, 306) can be greater than the minimum cross-sectional area of each of the auxiliary branches (116, 216, 316) in the network (106, 206, 306). Thus, the maximum cross-sectional area of a primary branch (108, 208, 308) in a network (106, 206, 306) can define a largest of the minimum cross-sectional areas of the branches of the network (106, 206, 306). Further, the maximum cross-sectional area of each first primary branch (108, 208, 308) in a network (106, 206, 306) can be greater than the maximum cross-sectional area of each of the auxiliary branches (116, 216, 316) of the network (106, 206, 306). Thus, the maximum cross-sectional area of a primary branch (108, 208, 308) in a network (106, 206, 306) can define a largest of the maximum cross-sectional areas of the branches of the network (106, 206, 306).

Referring specifically to FIGS. 1-4, a load-bearing part 100 according to one embodiment is shown that has a load-receiving member 102, at least one support member 104 that includes a first support member 104a, and at least a first network 106 of interconnected branches that includes a first network 106a of interconnected branches. The at least one support member 104 can include a second support member 104b that is spaced from the first support member 104a along a second direction $D_2$ and offset from the load-receiving member 102 along the first direction $D_1$. Further, the at least one network 106 can include a second network 106b of interconnected branches that is spaced from the first network 106a along the second direction $D_2$. In this embodiment, the load-bearing part 100 is a bumper beam for a vehicle such as an automobile or truck.

The first network 106a extends from the load-receiving member 102 to the first support member 104a. The first network 106a includes at least one primary branch 108 that includes a first primary branch 108a having a first primary-branch end 110 attached to the load-receiving member 102, a second primary-branch end 112 attached to the first support member 104a. The second primary-branch end 112 is spaced from the first primary-branch end 110 along both the first direction and a second direction opposite the second direction $D_2$.

The first network 106a also has at least one auxiliary branch 116, such as a plurality of auxiliary branches. In particular, in this embodiment, the first network 106a has four auxiliary branches 116a-116d, although alternative embodiments can have less than or greater than four auxiliary branches. Each of the auxiliary branches 116a-116d has a first auxiliary-branch end 124 attached to the primary-branch body 114 of the first primary branch 108a, between the first primary-branch end 110 and the second primary-branch end 112. Further, each of the auxiliary branches 116a-116d has a second auxiliary-branch end 126 attached to the load-receiving member 102. Thus, each of the at least one auxiliary branches 116a-116d extends from the primary-branch body 114 of the first primary-branch 108a to the load-receiving member 102.

The second auxiliary-branch ends 126 are spaced from one another and from the first primary-branch end 110 of the first primary-branch 108a so as to define (i) gaps 134 between the second auxiliary-branch ends 126 of the auxiliary branches 116a-116d, and between the first primary-branch end 110 of the first primary branch 108a and the second auxiliary-branch ends 126 of the auxiliary branches 116a-116d. The gaps 134 may be air gaps.

The second auxiliary branch 116b is spaced from the first auxiliary branch 116a along the third direction $D_3$, and the first and second auxiliary branches 116a and 116b have lengths $l_2$ from their respective first auxiliary-branch ends 124 to their respective second auxiliary-branch ends 126 along their respective axes of elongation $A_2$, the lengths $l_2$ being substantially equal. The third auxiliary branch 116c is spaced from the first auxiliary branch 116a along the second direction $D_2$, and the first auxiliary branch 116a has a length $l_2$ from its first auxiliary-branch end 124 to its second auxiliary-branch end 126 along its axis of elongation $A_2$ that is greater than the length $l_2$ of the third auxiliary branch 116c as measured from its first auxiliary-branch end 124 to its second auxiliary-branch end 126 along its axis of elongation $A_2$. The fourth auxiliary branch 116d is spaced from the third auxiliary branch 116c along the third direction $D_3$ and from the second auxiliary branch 116b along the second direction $D_2$. The length $l_2$ of the fourth auxiliary branch 116d as measured from its first auxiliary-branch end 124 to its second auxiliary-branch end 126 along its axis of elongation $A_2$ is substantially equal to the length $l_2$ of the third auxiliary branch 116c as measured from its first auxiliary-branch end 124 to its second auxiliary-branch end 126 along its axis of elongation $A_2$. The lengths $l_2$ of the first to fourth auxiliary branches 116a-116d are less than the length $l_1$ of the first primary branch 108a.

The second network 108b of interconnected branches can be a substantial mirror image of the first network 108a of interconnected branches about a plane $P_1$ that extends along the first direction $D_1$ and the third direction $D_3$, where the plane $P_1$ is spaced from the first network 108a in the second direction $D_2$. Thus, the load-bearing part 100 can be symmetric about the plane $P_1$, although embodiments of the disclosure can be asymmetric (e.g., when loading on the part will be not be uniform). The second network 106b has a second primary branch 108b having a first primary-branch end 110 attached to the load-receiving member 102 and a second primary-branch end 112 attached to the second support member 104b. The second network 108b further has at least one auxiliary branch 116, such as a plurality of auxiliary branches 116e-116h. Each of the auxiliary branches 116e-116h has a first auxiliary-branch end 124 attached to the second primary branch 108b and a second auxiliary-branch end 126 attached to the load-receiving member 102.

The second auxiliary branch 116f is spaced from the first auxiliary branch 116e along the third direction $D_3$, and the first and second auxiliary branches 116e and 116f have lengths $l_2$ from their respective first auxiliary-branch ends 124 to their respective second auxiliary-branch ends 126 along their respective axes of elongation $A_2$, the lengths $l_2$ being substantially equal. The third auxiliary branch 116g is spaced from the first auxiliary branch 116e along a direction opposite the second direction $D_2$, and the first auxiliary branch 116e has a length $l_2$ from its first auxiliary-branch end 124 to its second auxiliary-branch end 126 along its axis of elongation $A_2$ that is greater than the length $l_2$ of the third auxiliary branch 116g as measured from its first auxiliary-branch end 124 to its second auxiliary-branch end 126 along its axis of elongation $A_2$. The fourth auxiliary branch 116h is spaced from the third auxiliary branch 116g along the third direction $D_3$ and from the second auxiliary branch 116f along a direction opposite the second direction $D_2$. The length $l_2$ of the fourth auxiliary branch 116h as measured from its first auxiliary-branch end 124 to its second auxiliary-branch end 126 along its axis of elongation $A_2$ is substantially equal to the length $l_2$ of the third auxiliary branch 116g as measured from its first auxiliary-branch end 124 to its second auxiliary-branch end 126 along its axis of elongation $A_2$. The lengths $l_2$ of the first to fourth auxiliary branches 116e-h are less than the length $l_1$ of the second primary branch 108b.

Turning now to FIGS. 5-8, a load-bearing part 200 according to another embodiment is shown that is configured to resist a load. The load-bearing part 200 has a load-receiving member 202, at least one support member 204, and at least one network 206 of interconnected branches. The at least one network 206 can have at least one of (i) a first network 206a of interconnected branches, (ii) a second network 206b of interconnected branches spaced from the first network 206a in a second direction $D_2$, perpendicular to the first direction $D_1$, (iii) a third network 206c of interconnected branches spaced from the first network 206a in a third direction $D_3$, perpendicular to both the first and second directions $D_1$ and $D_2$, and (iv) a fourth network 206d of interconnected branches that is spaced from the second network 206b in the third direction $D_3$ and the third network 206c in the second direction $D_2$. Each of the networks 206a-206b can extend from the load-receiving member 202 to the support member 204. In this embodiment, the load-bearing part 200 is a bumper energy absorber that attaches to a bumper beam of a vehicle such as an automobile or truck.

The first network 206a has at least one primary branch 208 that includes a first primary branch 208a and a second primary branch 208b, where the first primary branch 208a is spaced from the second primary branch 208b in a second direction $D_2$, perpendicular to the first direction $D_1$. Each of the first and second primary branches 208a and 208b has a first primary-branch end 210 attached to the load-receiving member 202, and a second primary-branch end 212 attached to the support member 204.

The first network 206a also has at least one auxiliary branch 216. The auxiliary branch 216 has a first auxiliary-branch end 224 attached to the primary-branch body 214 of the first primary branch 208a, between the first primary-branch end 210 and the second primary-branch end 212. Further, the branch 216 has a second auxiliary-branch end 226 attached to the second primary branch 208b, between the first primary-branch end 210 and the second primary-branch end 212. Thus, the auxiliary branch 216 extends from the primary-branch body 214 of the first primary branch 208a to the primary-branch body 214 of the second primary branch 208b.

The load-bearing part 200 can define a gap 234a that extends from the second primary branch 208b to the first primary branch 208a in the second direction, and that extends from the auxiliary branch 216 to the support member 202 in the first direction. The load-bearing part can also define a gap 234b that extends from the second primary branch 208b to the first primary branch 208a in the second direction, and that extends from the load-receiving member 202 to the auxiliary branch 216 in the first direction. The gaps 234a and 234b may be air gaps.

The second network 206b of interconnected branches can be a substantial mirror image of the first network 206a of interconnected branches about a plane $P_1$ that extends along both the first direction $D_1$ and a third direction $D_3$ that is perpendicular to both the first direction $D_1$ and a second direction $D_2$. The third network 206c of interconnected branches can be a substantial mirror image of the first network 206a of interconnected branches about a plane $P_2$ that extends along both the first direction $D_1$ and a second direction $D_2$ that is perpendicular to both the first direction $D_1$ and the third direction $D_3$. The fourth network 206d of interconnected branches is a substantial mirror image of the third network 206c of interconnected branches about a plane $P_1$ that extends along both the first direction $D_1$ and the third direction $D_3$. The fourth network 206d can also be a substantial mirror image of the second network 206b about a plane $P_2$ that extends along both the first direction $D_1$ and the second direction $D_2$. Thus, the part 200 can be symmetric about plane $P_1$ and plane $P_2$, although embodiments of the disclosure can be asymmetric (e.g., when loading on the part will not be uniform). Note that an auxiliary branch 264 extends from the body 214 of the first primary branch 208a to the support member 204. The second, third, and fourth networks 206b-206d, may or may not have a mirror image of support member 264.

Referring to FIGS. 9-12, a load-bearing part 300 according to another embodiment is shown that is configured to resist a load. The load-bearing part 300 has a load-receiving member 302, a support member 304, and a network 306 of interconnected branches. In this embodiment, the load-bearing part 300 is a crush box for the bumper of a vehicle such as an automobile or truck.

The network 306 has at least one primary branch 308 that can include at least one of first, second, third, and fourth primary branches 308a-308d. The fourth primary branch 308d is spaced from the second primary branch 308b along a second direction $D_2$, perpendicular to the first direction $D_1$. The fourth primary-branch 308d can be a substantial mirror image of the third primary-branch 308c about a plane $P_1$ that extends along the both first direction $D_1$ and the third direction $D_3$. Further, the second primary branch 308b is spaced from the first primary branch 308a along a third direction $D_3$, perpendicular to both the first and second directions $D_1$ and $D_2$. The second primary branch 308b can be a substantial mirror image of the first primary-branch 308a about a plane $P_2$ that extends along the both first direction $D_1$ and the second direction $D_2$. Further, the third primary branch 308c can be a substantial copy of the first primary branch 308a, rotated by 90 degrees. Each of the primary branches 308 has a first primary-branch end 310, and a second primary-branch end 312 that is offset from the first primary-branch end 310 in the first direction $D_1$ and attached to the support member 304.

The network 306 also has as at least one auxiliary branch 316. The at least one auxiliary branch 316 can include auxiliary branches 316a-316d. A first auxiliary branch 316a has a first auxiliary-branch end 324 that is attached to the first primary-branch ends 310 of one or both of the first and third primary branches 308a and 308c, and a second auxiliary-branch end 326 attached to the load-receiving member 302. A second auxiliary branch 316b of the network 306 has a first auxiliary-branch end 324 attached to the first primary-branch ends 310 of one or both of the second and third primary branches 308b and 308c, and a second auxiliary-branch end 326 attached to the load-receiving member 302. A third auxiliary branch 316c of the network 306 has a first auxiliary-branch end 324 attached to the first primary-branch ends 310 of one or both of the second and fourth primary branches 308b and 308d, and a second auxiliary-branch end 326 attached to the load-receiving member 302. A fourth auxiliary branch 316d has a first auxiliary-branch end 324 attached to the first primary-branch ends 310 of one or both of the first and fourth primary branches 308a and 308d, and a second auxiliary-branch end 326 attached to the load-receiving member 302.

The at least one auxiliary branch 316 can further include at least one, such as two, other auxiliary branches 316e extending from the auxiliary-branch body 328 of each of at least one of the first to fourth auxiliary branches 316a-316d to the load-receiving member 302. Each of the other auxiliary branches 316e has a first auxiliary-branch end 324 attached to an auxiliary-branch body 328 of one of the first to fourth auxiliary branches 316a-316d, and a second auxiliary-branch end 326 attached to the load-receiving member 302. Each of the other auxiliary branches 316e can extend away from a central axis $A_c$ of the load-bearing part 300 as it extends from its first auxiliary-branch end 324 to its second auxiliary-branch end 326. The central axis $A_c$ extends from the load-receiving member 302 to the support member 304 in the first direction $D_1$.

Further, the at least one auxiliary branch 316 can include at least one other auxiliary branch 316f extending from each of at least one of the first to fourth primary branches 308a-308d to the support member 304. Each of the other auxiliary branches 316f has a first auxiliary-branch end 324 attached to an auxiliary-branch body 328 of one of the primary branches 308a-308d, and a second auxiliary branch end 326 attached to the support member 304. Each of the other auxiliary branches 316e can extend away from the central axis $A_c$ of the load-bearing part 300 as it extends from its first auxiliary-branch end 324 to its second auxiliary-branch end 326. The load-bearing part 300 can define a plurality of gaps 334 that each extend (i) between ones of the at least one auxiliary branch 316, or (ii) between an auxiliary branch and a primary branch. The gaps 334 may be air gaps.

Figure 14:
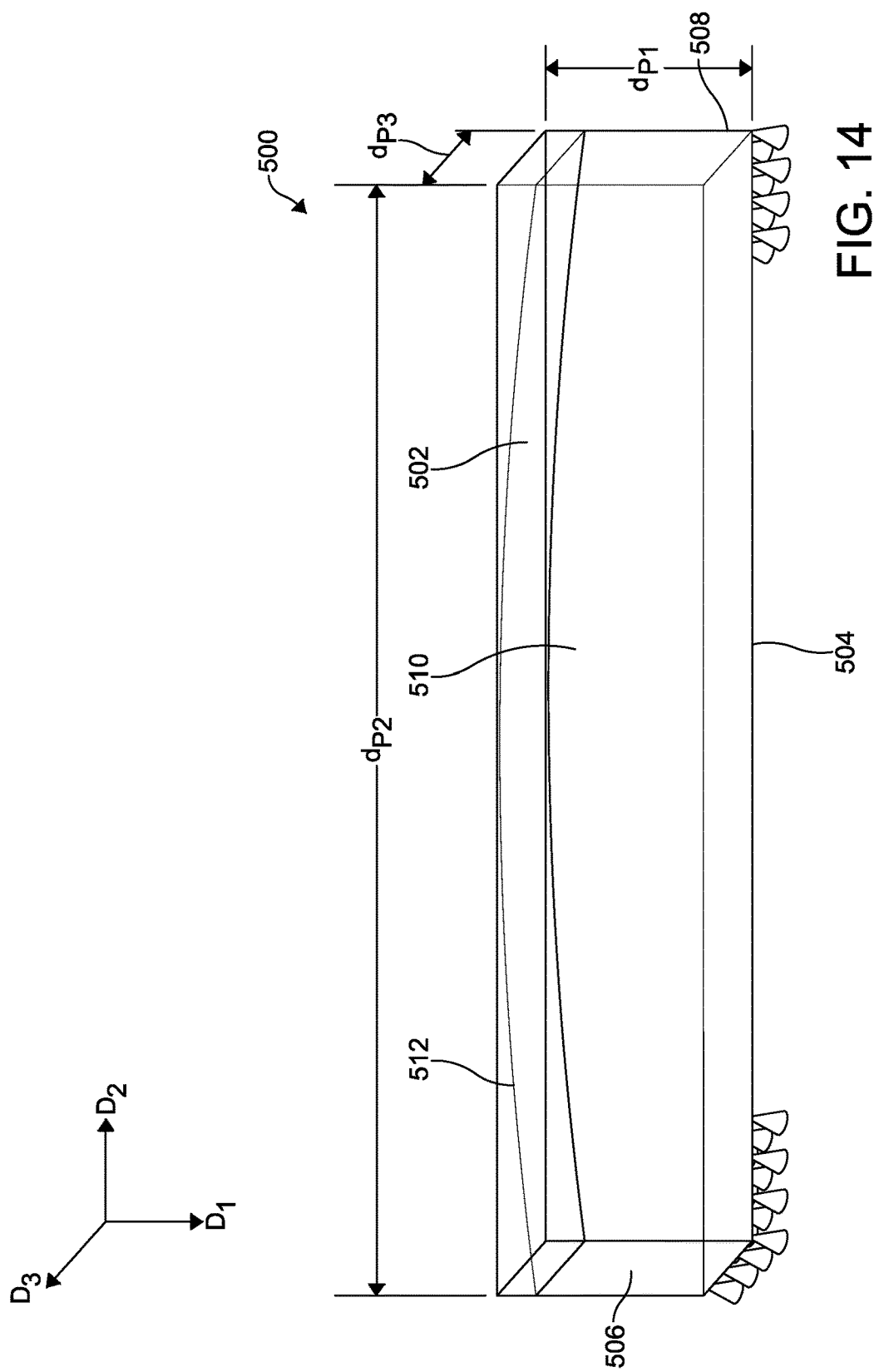
FIG. 14 shows a perspective view of a computer model of a first three-dimensional shape generated using the method of FIG. 13.

Turning now to FIGS. 13 and 14, a block diagram is shown of a method 400 of designing a load-bearing part such as any of the load-bearing parts in FIGS. 1-12. In step 402, various design requirements for the particular application are determined, such as (without limitation) the boundary conditions for the part, the maximum three-dimensional design space that is permitted for the load-bearing part considering where the part is to be used, the particular locations where a load will be applied, the amount of load that will the part will withstand at those locations, the material from which the part will be formed, and so on.

In step 404, a first computer model of a first three-dimensional shape of the load-bearing part is generated. As an example, consider FIG. 14, which shows an exemplary first computer model that can be used in designing the load-bearing part 100 of FIG. 1. In this embodiment, the first three-dimensional shape is a rectangular box, although other shapes may be used for other load-bearing parts. As shown, the first three-dimensional shape 500 can have a mass, a load-receiving outer surface 502 that will form the outer surface 140 of the load-receiving member 102 of FIG. 1, and a support outer surface 504, portions of which will form the outer surfaces of 152 of the first and second support members 104a and 104b of FIG. 1. The load-receiving outer surface 502 is offset from the support outer surface 504 along a first direction $D_1$. The first three-dimensional shape 500 can have opposed first and second ends 506 and 508 that each extend from the load-receiving outer surface 502 to the support outer surface 504. Further, first three-dimensional shape 500 can have opposed first and second sides 510 and 512 that each extend from the load-receiving outer surface 502 to the support outer surface 504 and from the first end 506 to the second end 508. The first three-dimensional shape 500 has a first maximum dimension $d_{P1}$ from the load-receiving outer surface 502 to support outer surface 504 along the first direction $D_1$, a second maximum dimension $d_{P2}$ from the first end 506 to the second end 508 in a second direction $D_2$, perpendicular to the first direction $D_1$, and a third maximum dimension $d_{P3}$ from the first side 510 to the second side 512 in a third direction $D_3$, perpendicular to the first and second dimensions $D_1$ and $D_2$. The first three-dimensional shape can be solid as it extends from the load-receiving outer surface 502 to support outer surface 504, from the first end 506 to the second end 508, and from the first side 510 to the second side 512.

In step 406, a target mass remaining is selected for a second computer model of a second three-dimensional shape of the load-bearing part, and in step 408, the first computer model of the first three-dimensional shape 500 is modified so as to define the second computer model of the second three-dimensional shape for the load-bearing part. The modifying step 408 includes removing a first mass from first three-dimensional shape 500 so as to obtain the second three-dimensional shape having the target mass remaining. The first mass is removed from the first three-dimensional shape between the load-receiving outer surface 502 and the support-member outer surface 504, between the first and second ends 506 and 508, and between the first and second sides 510 and 512. In some examples, the target mass remaining can be up to 30 percent of the mass. In other examples, the target mass remaining can be up to 20 percent of the mass. In yet other examples, the target mass remaining can be up to 10 percent of the mass. In yet still other examples, the target mass remaining can be up to 5 percent of the mass.

The removing of the first mass in step 408 can be performed so as to maintain a stiffness of the second three-dimensional shape within less than or equal to about ten percent of a maximized stiffness for the target mass. In some embodiments, the removing step can be performed so as to maximize stiffness of the second three-dimensional shape at the target mass. The removing of the first mass in step 408 can additionally or alternatively be performed so as to maintain a natural frequency of the second three-dimensional shape at the stiffness and target mass to within less than or equal to about ten percent of a maximized natural frequency. In some embodiments, the removing step can be performed so as to maximize the natural frequency of the second three-dimensional shape at the target mass. The removing of the first mass in step 408 can additionally or alternatively be performed so as to maintain an average internal energy of the second three-dimensional shape at the stiffness and target mass to within less than or equal to about ten percent of a maximized average internal energy. In some embodiments, the removing step can be performed so as to maximize the average internal energy of the second three-dimensional shape at the target mass. The first computer model of the first three-dimensional shape and the second computer model of the second three-dimensional shape can be generated using topology optimizing software such as (without limitation) Solid Thinking® Inspire®.

Once the first mass is removed to arrive at the target mass remaining, the second three-dimensional shape can define at least one network of interconnected branches such as (without limitation) at least one of the networks 106, 206, and 306 shown in FIGS. 1-12. Note that, in embodiments that are symmetric about a plane (e.g., where boundary conditions and loads are symmetric about the plane), step 408 can be performed to generate fewer than all of the networks of branches (e.g., 106a, 206a), and the remaining network or networks of branches (e.g., 106b, 206b, 206c, 206d) can be generated using software by duplicating, rotating, and/or mirroring the generated network. Further, the second three-dimensional shape can be obtained so as to maintain the first maximum dimension $d_{P1}$, the second maximum dimension $d_{P2}$, and the third maximum dimension $d_{P3}$ to within ten percent. In other words, the second three-dimensional shape can have substantially the same overall dimensions as the first three-dimensional shape to within ten percent. In some embodiments, the second three-dimensional shape can be obtained so as leave the first maximum dimension $d_{P1}$, the second maximum dimension $d_{P2}$, and the third maximum dimension $d_{P3}$ unchanged.

Due to the amount of mass removed in step 408, the second three-dimensional part might not meet loading requirements for the load-bearing part. Therefore, in step 410, a second mass is added to the second computer model of the second three-dimensional shape so as to obtain a third computer model of a third three-dimensional shape. The second mass can be added such that the third three-dimensional shape meets a specified loading requirement. In some examples, the second mass can be within ten percent of a minimum amount of mass needed to meet the specified loading requirement. The second mass is less than the first mass, and thus, the adding step causes the third three-dimensional shape to have a mass greater than the target mass but less than that of the first three-dimensional shape. The second mass can be added using software such as (without limitation) size optimization software including, for example, Livermore Software Technology Corporation (LSTC)™ LS-OPT™, Altair™ Optistruct™, and Simulia™ TOSCA™.

The third three-dimensional shape can define at least one network of interconnected branches such as at least one of the networks 106, 206, and 306 shown in FIGS. 1-12. Thus, the individual branches of the network of interconnected branches can be maintained when the second mass is added to the second three-dimensional shape. The second mass can be added to one or more of the at least one primary branch (108, 208, 308) so as to change the cross-sectional areas of the cross-sections (130, 230, 330) of the one or more of the at least one primary branch (108, 208, 308). Additionally, or alternatively, the second mass can be added to one or more of the at least one auxiliary branch (116, 216, 316) so as to change the cross-sectional areas of the cross-sections (136, 236, 336) of the one or more of the at least one auxiliary branch (116, 216, 316).

In step 412, the third computer model of the third three-dimensional shape can be further modified if necessary to account constraints of the forming process employed. For example, for three-dimensional printing, the third-three dimensional shape can be modified to remove overhanging features.

In step 414, the load-bearing part is formed to have the third three-dimensional shape. The forming can be, for example, three-dimensional printing, injection molding, or any other suitable type of forming.

It should be appreciated that the present disclosure can include at least any one up to all of the following examples:

Example 1

A load-bearing part configured to resist a load, the load-bearing part comprising: a load-receiving member that defines an outer surface configured to receive a load; a support member offset from the load-receiving member along a first direction; a network of interconnected branches, the network extending from the load-receiving member to the support member, the network of interconnected branches including: at least one primary branch, each having a first primary-branch end attached to one of the load-receiving member and the support member; and at least one auxiliary branch having a first auxiliary-branch end attached to a first primary branch of the at least one primary branch, and a second auxiliary-branch end attached to one of (i) the load-receiving member, (ii) the support member, and (iii) a second primary branch of the at least one primary branch.

Example 2

The load-bearing part of Example 1, wherein the at least one primary branch has a second primary-branch end offset from the first primary-branch end.

Example 3

The load-bearing part of Example 2, wherein the second primary-branch end is attached to the other of the load-receiving member and the support member.

Example 4

The load-bearing part of any of Examples 2 to 3, wherein the at least one primary branch further comprises a primary-branch body that extends from the first primary-branch end to the second primary-branch end.

Example 5

The load-bearing part of Example 4, wherein the primary-branch body is elongate as it extends from the first primary-branch end to the second primary-branch end along an axis of elongation.

Example 6

The load-bearing part of Example 4, wherein the primary-branch body is defined by only one axis of elongation.

Example 7

The load-bearing part of Example 5, wherein the axis of elongation is curved as it extends from the first primary-branch end to the second primary-branch end.

Example 8

The load-bearing part of any of Examples 6 to 7, wherein the primary-branch body defines a maximum length along the axis of elongation, a maximum width in a direction perpendicular to the axis of elongation, and a maximum thickness in another direction perpendicular to the axis of elongation, the maximum length being greater than the maximum width and the maximum thickness.

Example 9

The load-bearing part of any of the preceding Examples, wherein the primary-branch body defines a plurality of primary-branch cross-sectional planes along an axis of elongation of the at least on primary branch, the plurality of primary-branch cross-sectional planes being perpendicular to the axis of elongation of the at least one primary branch, the primary-branch cross-sectional planes each defining a primary-branch cross-sectional area of the primary-branch body.

Example 10

The load-bearing part of Example 9, wherein the primary-branch cross-sectional areas vary as they extend from the first primary-branch end to the second primary-branch end.

Example 11

The load-bearing part of any of Examples 9 and 10, wherein the primary-branch cross-sectional areas decrease as they extend from the first primary-branch end toward a middle of the primary-branch body along the axis of elongation.

Example 12

The load-bearing part of any of Examples 9 to 11, wherein the primary-branch cross-sectional areas decrease as they extend from the second primary-branch end toward a middle of the primary-branch body along the axis of elongation.

Example 13

The load-bearing part of any of the preceding Examples, wherein the at least one primary branch has an outer surface that defines an outer perimeter of the at least one primary branch, wherein the outer perimeter is solid along an entirety of the at least one primary branch.

Example 14

The load-bearing part of Example 13, wherein the outer perimeter is devoid of any holes extending through the outer perimeter.

Example 15

The load-bearing part of any of the preceding Examples, wherein the first auxiliary-branch end of the at least one auxiliary branch is attached to the first primary branch at the second primary-branch end.

Example 16

The load-bearing part of Example 15, wherein the second auxiliary-branch end of the at least one auxiliary branch is attached to the load-receiving member such that the at least one auxiliary branch extends from the second primary-branch end to the load-receiving member.

Example 17

The load-bearing part of Example 15, wherein the second auxiliary-branch end of the at least one auxiliary branch is attached to the support member such that the at least one auxiliary branch extends from the second primary-branch end to the support member.

Example 18

The load-bearing part of Example 15, wherein the second auxiliary-branch end of the at least one auxiliary branch is attached to the second primary branch such that the at least one auxiliary branch extends from the second primary-branch end to the second primary branch.

Example 19

The load-bearing part of any of Examples 1 to 14, wherein the first auxiliary-branch end of the at least one auxiliary branch is attached to the body of the first primary branch between the first and second primary-branch ends.

Example 20

The load-bearing part of Example 19, wherein the second auxiliary-branch end of the at least one auxiliary branch is attached to the load-receiving member such that the at least one auxiliary branch extends from the primary-branch body to the load-receiving member.

Example 21

The load-bearing part of Example 20, wherein the first primary-branch end is attached to the load-receiving member, and the second auxiliary-branch end is spaced from the first primary-branch end along a second direction, perpendicular to the first direction, so as to define a gap between the second auxiliary-branch and the first primary-branch end.

Example 22

The load-bearing part of Example 19, wherein the second auxiliary-branch end of the at least one auxiliary branch is attached to the support member such that the at least one auxiliary branch extends from the second primary-branch end to the support member.

Example 23

The load-bearing part of Example 22, wherein the second primary-branch end is attached to the support member, and the second auxiliary-branch end is spaced from the second primary-branch end along a second direction, perpendicular to the first direction, so as to define a gap between the second auxiliary-branch end and the second primary-branch end.

Example 24

The load-bearing part of any of the preceding Examples, comprising the second primary branch, spaced from the first primary branch along a second direction, perpendicular to the first direction, and the second auxiliary-branch end is attached to the second primary branch such that the auxiliary branch extends from the first primary branch to the second primary branch.

Example 25

The load-bearing part of Example 24, wherein the load-bearing part defines a gap that extends from the second primary branch to the first primary branch in the second direction, and that extends from the auxiliary branch to the support member in the first direction.

Example 26

The load-bearing part of Example 24, wherein the load-bearing part defines a gap that extends from the second primary branch to the first primary branch in the second direction, and that extends from the load-receiving member to the auxiliary branch in the first direction.

Example 27

The load-bearing part of any of Examples 21, 23, 25, and 26, wherein the gap is an air gap.

Example 28

The load-bearing part of any of the preceding Examples, wherein the at least one auxiliary branch further comprises an auxiliary-branch body that extends from the first auxiliary-branch end to the second auxiliary-branch end.

Example 29

The load-bearing part of Example 28, wherein the auxiliary-branch body is elongate as it extends from the first auxiliary-branch end to the second auxiliary-branch end along an auxiliary-branch axis of elongation.

Example 30

The load-bearing part of Example 28, wherein the auxiliary-branch axis of elongation is the only axis of elongation of the auxiliary branch.

Example 31

The load-bearing part of Example 29, wherein the auxiliary-branch axis of elongation is curved as it extends from the first auxiliary-branch end to the second auxiliary-branch end.

Example 32

The load-bearing part of any of Examples 29 to 31, wherein the auxiliary-branch body defines a maximum length along the auxiliary-branch axis of elongation, a maximum width in a direction perpendicular to the auxiliary-branch axis of elongation, and a maximum thickness in another direction perpendicular to the auxiliary-branch axis of elongation, the maximum length being greater than the maximum width and the maximum thickness.

Example 33

The load-bearing part of any of the preceding Examples, wherein the auxiliary-branch body defines a plurality of auxiliary-branch cross-sectional planes along an auxiliary axis of elongation, the plurality of auxiliary-branch cross-sectional planes being perpendicular to the auxiliary-branch axis of elongation, the auxiliary-branch cross-sectional planes each defining an auxiliary-branch cross-sectional area of the auxiliary-branch body.

Example 34

The load-bearing part of Example 33, wherein the auxiliary-branch cross-sectional areas vary as they extend from the first auxiliary-branch end to the second auxiliary-branch end.

Example 35

The load-bearing part of any of Examples 33 and 34, wherein the auxiliary-branch cross-sectional areas decrease as they extend from the first auxiliary-branch end toward a middle of the auxiliary-branch body along the auxiliary-branch axis of elongation.

Example 36

The load-bearing part of any of Examples 33 to 35, wherein the auxiliary-branch cross-sectional areas decrease as they extend from the second auxiliary-branch end toward a middle of the auxiliary-branch body along the auxiliary-branch axis of elongation.

Example 37

The load-bearing part of any of the preceding Examples, wherein the at least one auxiliary branch has an outer surface that defines an outer perimeter of the at least one auxiliary branch, wherein the outer perimeter of the auxiliary branch is solid along an entirety of the at least one auxiliary branch.

Example 38

The load-bearing part of Example 37, wherein the outer perimeter of the auxiliary branch is devoid of any holes extending through the outer perimeter of the auxiliary branch.

Example 39

The load-bearing part of any of the preceding Examples, wherein the load-receiving member defines an inner surface, opposite the outer surface, the inner surface connected to the network of interconnected branches such that the network of interconnected branches extends from the inner surface to the support member.

Example 40

The load-bearing part of Example 39, wherein the load-receiving member is a plate.

Example 41

The load-bearing part of Example 39, wherein the plate has opposed first and second ends that each extend from the outer surface to the inner surface, and opposed first and second sides that each extend from the outer surface to the inner surface and from the first end to the second end.

Example 42

The load-bearing part of Example 41, wherein the load-receiving member has a first load-receiving member dimension from the outer surface to the inner surface, a second load-receiving member dimension from the first side to the second side, and a third load-receiving member dimension from the first end to the second end.

Example 43

The load-bearing part of Example 42, wherein the second load-receiving member dimension is greater than or substantially equal to the third load-receiving member dimension, and the third load-receiving member dimension is greater than the first load-receiving member dimension.

Example 44

The load-bearing part of any of the preceding Examples, wherein the outer surface of the load-receiving member defines a plurality of discrete loading points that are spaced from one another along the outer surface and are configured to receive a load perpendicular to the outer surface.

Example 45

The load-bearing part of Example 44, wherein the network of interconnected branches forms a plurality of load pathways configured to resist the load, wherein each load pathway extends from the load-receiving member at a respective one of the discrete loading points to the support member.

Example 46

The load-bearing part of any of the preceding Examples, wherein the load-receiving member defines a plurality of holes extending through the outer surface and between respective ones of the branches of the plurality of branches.

Example 47

The load-bearing part of any of the preceding Examples, wherein the support member defines a support-member outer surface configured to react to the load.

Example 48

The load-bearing part of Example 47, wherein the support member defines a support-member inner member surface, opposite the support-member outer surface, the support-member inner surface connected to the network of interconnected branches such that the network of interconnected branches extends from the support-member inner surface to the load-receiving member.

Example 49

The load-bearing part of any of Examples 1 to 48, wherein the support member is a plate.

Example 50

The load-bearing part of Example 49, wherein the support-member has opposed support-member first and second ends that each extend from the support-member outer surface to the support-member inner surface, and opposed first and second sides that each extend from the support-member outer surface to the support-member inner surface and from the support-member first end to the support-member second end.

Example 51

The load-bearing part of Example 50, wherein the support member has a first support-member dimension from the support-member outer surface to the support-member inner surface, a second support-member dimension from the support-member first side to the support-member second side, and a third support-member dimension from the support-member first end to the support-member second end.

Example 52

The load-bearing part of Example 51, wherein the second support-member dimension is greater than or substantially equal to the third support-member dimension, and the third support-member dimension is greater than the first support-member dimension.

Example 53

The load-bearing part of any of the preceding Examples, wherein the support member defines a plurality of holes extending through the outer surface and between respective ones of the branches of the plurality of branches.

Example 54

The load-bearing part of any of the preceding Examples, wherein the at least one primary branch defines a plurality of primary-branch cross-sectional planes along an axis of elongation of the at least on primary branch, the plurality of primary-branch cross-sectional planes being perpendicular to the axis of elongation of the at least one primary branch, the primary-branch cross-sectional planes defining a minimum cross-sectional area of the at least one primary branch and a maximum cross-sectional area of the at least one primary branch.

Example 55

The load-bearing part of any of the preceding Examples, wherein the at least one auxiliary branch defines an auxiliary-branch cross-sectional plane that is perpendicular to an axis of elongation of the at least one auxiliary branch, the auxiliary-branch cross-sectional plane defining a minimum cross-sectional area of the at least one auxiliary branch and a maximum cross-sectional area of the at least one auxiliary branch.

Example 56

The load-bearing part of Example 55, wherein the minimum cross-sectional area of the at least one primary branch is greater than the minimum cross-sectional area of the at least one auxiliary branch.

Example 57

The load-bearing part of any of Examples 55 to 56, wherein the maximum cross-sectional area of the at least one primary branch is greater than the maximum cross-sectional area of the at least one auxiliary branch.

Example 58

The load-bearing part of any of the preceding Examples, wherein each branch of the network has a maximum cross-sectional dimension defined along a cross-sectional plane that is perpendicular to an axis of elongation of the branch, and the maximum cross-sectional area of the at least one primary branch defines a largest of the maximum cross-sectional areas of the branches.

Example 59

The load-bearing part of any of the preceding Examples, wherein each branch of the network has a maximum cross-sectional dimension defined along a cross-sectional plane that is perpendicular to an axis of elongation of the branch, and the maximum cross-sectional area of the at least one primary branch defines one of two largest of the maximum cross-sectional areas of the branches.

Example 60

The load-bearing part of any of the preceding Examples, wherein each branch of the network has a maximum cross-sectional dimension defined along a cross-sectional plane that is perpendicular to an axis of elongation of the branch, and the maximum cross-sectional area of the at least one primary branch defines one of four largest of the maximum cross-sectional areas of the branches.

Example 61

The load-bearing part of any of the preceding Examples, wherein the first primary branch has at least two auxiliary branches extending therefrom.

Example 62

The load-bearing part of example 61, wherein the first primary branch has at least three auxiliary branches extending therefrom.

Example 63

The load-bearing part of any of Examples 61 to 62, wherein each of the at least two auxiliary branches has a first auxiliary-branch end attached to the first primary branch, and a second auxiliary-branch end attached to one of (i) the load-receiving member, (ii) the support member, and (iii) the second primary branch.

Example 64

The load-bearing part of any of the preceding Examples, wherein the at least one auxiliary branch has at least one other auxiliary branch extending therefrom.

Example 65

The load-bearing part of Example 64, wherein the at least one other auxiliary branch has a first auxiliary-branch end attached to the at least one auxiliary branch, and a second auxiliary-branch end attached to one of (i) the load-receiving member, (ii) the support member, and (iii) the second primary branch.

Example 66

The load-bearing part of any of the preceding Examples, wherein the load-bearing part is elongate along a second direction, perpendicular to the first direction.

Example 67

The load-bearing part of any of the preceding Examples, comprising the network of interconnected branches and a second network of interconnected branches spaced from the network of interconnected branches along a second direction, perpendicular to the first direction.

Example 68

The load-bearing part of Example 68, wherein the first primary-branch end is attached to the load-receiving member, the network has a second primary-branch end that is attached to the support member, and the second primary-branch end is spaced from the first primary-branch end along both the first direction and a second direction opposite the second direction.

Example 69

The load-bearing part of Example 68, wherein the at least one auxiliary branch comprises first and second auxiliary branches, each having a first auxiliary-branch end attached to the first primary branch and a second auxiliary-branch end attached to the load-receiving member, wherein the first auxiliary branch is spaced from the second auxiliary branch along one of the second direction and a third direction that is perpendicular to both the first and second directions.

Example 70

The load-bearing part of Example 69, wherein the second auxiliary branch is spaced from the first auxiliary branch along the second direction, each of the first and second auxiliary branches has a length from the first auxiliary-branch end to the second auxiliary-branch end along an axis of elongation, and the length of the first auxiliary branch is greater than the length of the second auxiliary branch.

Example 71

The load-bearing part of any of Examples 70, wherein the first auxiliary branch is spaced from the second auxiliary branch along the second direction, and the at least one auxiliary branch comprises a third auxiliary branch having a first auxiliary-branch end attached to the first primary branch and a second auxiliary-branch end attached to the load-receiving member, wherein the third auxiliary branch is spaced from one of the first and second auxiliary branches along a third direction that is perpendicular to both the first and second directions.

Example 72

The load-bearing part of Example 71, wherein each of the auxiliary branches has a length from the first auxiliary-branch end to the second auxiliary-branch end along an axis of elongation, and the length of the third auxiliary branch is substantially equal to the length of the one of the first and second auxiliary branches.

Example 73

The load-bearing part of Example 70, wherein the first auxiliary branch is spaced from the second auxiliary branch the third direction, each of the first and second auxiliary branches has a length from the first auxiliary-branch end to the second auxiliary-branch end along an axis of elongation, and the length of the first auxiliary branch is substantially equal to the length of the second auxiliary branch.

Example 74

The load-bearing part of any of Examples IS1 to IS4b, wherein the second network of interconnected branches is a substantial mirror image of the first network of interconnected branches about a plane that extends along the first direction and a third direction that is perpendicular to both the first and second directions.

Example 75

The load-bearing part of any of Examples 67 to 74, wherein the load-bearing part comprises a second support member that is spaced from the first support member along the second direction and is offset from the load-receiving member in the first direction, the second network extending from the load-receiving member to the second support member.

Example 76

The load-bearing part of Example 75, wherein the second network comprises: a second primary branch having a first primary-branch end attached to the load-receiving member and a second primary-branch end attached to the second support member; and at least one auxiliary branch having a first auxiliary-branch end attached to the second primary branch and a second auxiliary-branch end attached to the load-receiving member.

Example 77

The load-bearing part of Example 76, wherein the at least one auxiliary branch of the second network comprises first and second auxiliary branches, each having a first auxiliary-branch end attached to the second primary branch and a second auxiliary-branch end attached to the load-receiving member, wherein the first auxiliary branch of the second network is spaced from the second auxiliary branch of the second network along one of the second direction and a third direction that is perpendicular to both the first and second directions.

Example 78

The load-bearing part of Example 77, wherein the first auxiliary branch of the second network is spaced from the second auxiliary branch of the second network along the second direction, each of the first and second auxiliary branches of the second network has a length from the first auxiliary-branch end to the second auxiliary-branch end along an axis of elongation, and the length of the first auxiliary branch of the second network is greater than the length of the second auxiliary branch.

Example 79

The load-bearing part of Example 78, wherein the first auxiliary branch of the second network is spaced from the second auxiliary branch of the second network along the second direction, and the at least one auxiliary branch of the second network comprises a third auxiliary branch having a first auxiliary-branch end attached to the second primary branch and a second auxiliary-branch end attached to the load-receiving member, wherein the third auxiliary branch of the second network is spaced from one of the first and second auxiliary branches of the second network along a third direction that is perpendicular to both the first and second directions.

Example 80

The load-bearing part of Example 79, wherein each of the auxiliary branches of the second network has a length from the first auxiliary-branch end to the second auxiliary-branch end along an axis of elongation, and the length of the third auxiliary branch of the second network is substantially equal to the length of the one of the first and second auxiliary branches of the second network.

Example 81

The load-bearing part of Example 78, wherein the first auxiliary branch of the second network is spaced from the second auxiliary branch of the second network along the third direction, each of the first and second auxiliary branches of the second network has a length from the first auxiliary-branch end to the second auxiliary-branch end along an axis of elongation, and the length of the first auxiliary branch of the second network is substantially equal to the length of the second auxiliary branch of the second network.

Example 82

The load-bearing part of any of the preceding Examples, wherein the load-bearing part is a bumper beam.

Example 83

The load-bearing part of Example 67, wherein the network comprises the first primary branch and the second primary branch, each having a first primary-branch end attached to the load-receiving member and a second primary-branch end attached to the support member.

Example 84

The load-bearing part of Example 83, wherein the second-auxiliary branch end is attached to the second primary branch.

Example 85

The load-bearing part of Example 83, wherein the second network of interconnected branches is a substantial mirror image of the first network of interconnected branches about a plane that extends along one of (i) both the first direction and a third direction that is perpendicular to both the first and second directions and (ii) both the first direction and the second direction.

Example 86

The load-bearing part of Example 85, comprising a third network of interconnected branches, wherein the second network is a substantial mirror image of the first network of interconnected branches about a plane that extends along both the first direction and a third direction that is perpendicular to both the first and second directions, and the third network is a substantial mirror image of the first network about a plane that extends along both the first direction and the second direction.

Example 87

The load-bearing part of Example 86, comprising a fourth network of interconnected branches, wherein the fourth network is a substantial mirror image of the third network of interconnected branches about a plane that extends along both the first direction.

Example 88

The load-bearing part of any of Examples 86 and 87, comprising a fourth network of interconnected branches, wherein the fourth network is a substantial mirror image of the second network about a plane that extends along both the first direction and the second direction.

Example 89

The load-bearing part of any of Examples 1 to 66 and 83 to 86, wherein the load-bearing part is a bumper energy absorber configured to attach to a bumper beam.

Example 90

The load-bearing part of any of Examples 1 to 65, wherein the network comprises first and second primary branches, each having a first primary-branch end attached to the support member, and a second primary-branch end offset from the first primary-branch end in the first direction.

Example 91

The load-bearing part of Example 90, wherein the first and second primary branches are spaced from one another in the third direction along a first plane that extends in both the first and third directions.

Example 92

The load-bearing part of any of Examples 90 and 91, wherein the second primary branch is a mirror-image of the first primary branch about a second plane that extends in both the first and second directions.

Example 93

The load-bearing part of any of Examples 90 to 92, wherein the network comprises a third primary branch having a first primary-branch end attached to the support member, and a second primary-branch end offset from the first primary-branch end in the first direction.

Example 94

The load-bearing part of Example 93, wherein the third primary branch is a substantial copy of the first primary branch rotated by 90 degrees about an axis that extends in first direction.

Example 95

The load-bearing part of any of Examples 93 to 94, wherein the network comprises a fourth primary branch having a first primary-branch end attached to the support member, and a second primary-branch end offset from the first primary-branch end in the first direction.

Example 96

The load-bearing part of Example 95, wherein the third and fourth primary branches are spaced from one another in the second direction along a first plane that extends in both the first and second directions.

Example 97

The load-bearing part of any of Examples 95 and 96, wherein the fourth primary branch is a mirror-image of the third primary branch about the first plane that extends in both the first and second directions.

Example 98

The load-bearing part of any of Examples 90 to 97, wherein the first auxiliary-branch end of the auxiliary branch is attached to the first primary-branch end of at least one of the first and third primary branches, and the second auxiliary branch end of the auxiliary branch is attached to the load-receiving member.

Example 99

The load-bearing part of Example 98, wherein the first auxiliary-branch end of the auxiliary branch is attached to the first primary-branch ends of both the first and third primary branches.

Example 100

The load-bearing part of any of Examples 98 and 99, comprising a second auxiliary branch having a first auxiliary-branch end attached to the first primary-branch end of at least one of the second and third primary branches, and a second auxiliary-branch end attached to the load-receiving member.

Example 101

The load-bearing part of Example 100, wherein the first auxiliary-branch end of the second auxiliary branch is attached to the first primary-branch ends of both the second and third primary branches.

Example 102

The load-bearing part of any of Examples 100 and IU6a, comprising a third auxiliary branch having a first auxiliary-branch end attached to the first primary-branch end of at least one of the third and fourth primary branches, and a second auxiliary-branch end attached to the load-receiving member.

Example 103

The load-bearing part of Example 102, wherein the first auxiliary-branch end of the third auxiliary branch is attached to the first primary-branch ends of both the third and fourth primary branches.

Example 104

The load-bearing part of any of Examples 102 and 103, comprising a fourth auxiliary branch having a first auxiliary-branch end attached to the first primary-branch end of at least one of the first and fourth primary branches, and a second auxiliary-branch end attached to the load-receiving member.

Example 105

The load-bearing part of Example 104, wherein the first auxiliary-branch end of the fourth auxiliary branch is attached to the first primary-branch ends of both the first and fourth primary branches.

Example 106

The load-bearing part of Examples 98 to 105, comprising at least one other auxiliary branch extending from an auxiliary-branch body of each of at least one of the first to fourth auxiliary branches to the load-receiving member.

Example 107

The load-bearing part of Example 106, comprising at least one other auxiliary branch extending from an auxiliary-branch body of each of the first to fourth auxiliary branches to the load-receiving member.

Example 108

The load-bearing part of any of Examples 106 and 107, comprising at least two other auxiliary branches extending from the auxiliary-branch body of each of the at least one of the first to fourth auxiliary branches to the load-receiving member.

Example 109

The load-bearing part of Example 108, comprising at least two other auxiliary branches extending from the auxiliary-branch body of each of the first to fourth auxiliary branches to the load-receiving member.

Example 110

The load-bearing part of any of Examples 98 to 109, comprising at least one other auxiliary branch extending from each of at least one of the first to fourth primary branches to the support member.

Example 111

The load-bearing part of Examples 110, comprising at least one other auxiliary branch extending from each the first to fourth primary branches to the load-receiving member.

Example 112

The load-bearing part of any of Examples 106 to 111, wherein each of the other auxiliary members extends away from a central axis of the load-bearing part as it extends to the load-receiving member, wherein the central axis extends from the load-receiving member to the support member in the first direction.

Example 113

The load-bearing part of any of Examples 98 to 112, wherein the load-bearing part is a crush box for an automobile bumper.

Example 114

The load-bearing part of any of the preceding Examples, wherein the network is a monolithic part formed from a single material.

Example 115

The load-bearing part of any of the preceding Examples, wherein the load-receiving member, the support member, and the network form a monolithic part formed of a single material.

Example 116

The load-bearing part of any of Examples 114 and 115, wherein the material is Acrylonitrile butadiene styrene (ABS).

Example 117

The load-bearing part of any of Examples 114 and 115, wherein the material comprises polyetherimide or ULTEM.

Example 118

The load-bearing part of any of the preceding Examples, wherein the load-bearing part is formed by additive manufacturing.

Example 119

The load-bearing part of Example 118, wherein the additive manufacturing is three-dimensional printing.

Example 120

The load-bearing part of any of the preceding Examples, wherein the load-bearing part is formed by injection molding.

Example 121

The load-bearing part of any of the preceding Examples, wherein the load-bearing part is an automobile part.

Example 122

The load-bearing part of any of the preceding Examples, wherein the load-bearing part an automobile bumper part.

Example 123

A method of designing a load-bearing part configured to resist a load, the method comprising:
generating a first computer model of a first three-dimensional shape of the load-bearing part, the first three-dimensional shape having a mass, a load-receiving member outer surface, and a support-member outer surface that is offset from the load-receiving member outer surface along a first direction;
selecting a target mass remaining for a second computer model of a second three-dimensional shape of the load-bearing part;
modifying the first computer model of the first three-dimensional shape so as to define the second computer model of the second three-dimensional shape, wherein the modifying step comprises removing a first mass from first three-dimensional shape between the load-receiving member outer surface and the support-member outer surface, such that the second three-dimensional shape has the target mass remaining; and
adding a second mass to the second computer model of the second three-dimensional shape so as to obtain a third computer model of a third three-dimensional shape, wherein the second mass is less than the first mass,
wherein the adding step causes the third three-dimensional shape to have a mass greater than the target mass.

Example 124

The method of Example 123, wherein the first three-dimensional shape has opposed first and second ends that each extend from the load-receiving member outer surface to support-member outer surface, and opposed first and second sides that each extend from the load-receiving member outer surface to the support-member surface and from the first end to the second end.

Example 125

The method of Example 124, wherein the first three-dimensional shape has a first maximum load-bearing-part dimension from the load-receiving member outer surface to support-member outer surface, a second maximum load-bearing-part dimension from the first side to the second side, and a third maximum load-bearing-part dimension from the first end to the second end.

Example 126

The method of Example 125, wherein the second three-dimensional shape substantially maintains each of the first, second, and third maximum load-bearing-part dimensions.

Example 127

The method of Example 125, wherein the second three-dimensional shape maintains each of the first, second, and third maximum load-bearing-part dimensions to within ten percent.

Example 128

The method of any one of the preceding method Examples, wherein the removing of the first mass is performed so as to maintain a stiffness of the second three-dimensional shape within less than or equal to about ten percent of a maximized stiffness for the target mass.

Example 129

The method of Example 128, wherein the removing step is performed so as to maximize stiffness of the second three-dimensional shape.

Example 130

The method of any of Examples 128 and 129, wherein the removing of the first mass is performed so as to maintain a natural frequency of the second three-dimensional shape at the stiffness and target mass to within less than or equal to about ten percent of a maximized natural frequency.

Example 131

The method of Example 130, wherein the removing step is performed so as to maximize natural frequency of the second three-dimensional shape at the stiffness and target mass.

Example 132

The method of any of Examples 123 to 131, wherein the removing of the first mass is performed so as to maintain a natural frequency of the second three-dimensional shape at the target mass to within less than or equal to about ten percent of a maximized natural frequency.

Example 133

The method of Example 132, wherein the removing step is performed so as to maximize natural frequency of the second three-dimensional shape at the target mass.

Example 134

The method of any one of the preceding method Examples, wherein the target mass remaining in the removing step is up to 30 percent of the mass.

Example 135

The method of Example 134, wherein the target mass remaining in the removing step is up to 20 percent of the mass.

Example 136

The method of Example 134, wherein the target mass remaining in the removing step is up to 10 percent of the mass.

Example 137

The method of Example 134, wherein the target mass remaining in the removing step is up to 5 percent of the mass.

Example 138

The method of any one of the preceding method Examples, wherein the second three-dimensional shape has a shape of a load-bearing part as recited in any of Examples 1 to 122.

Example 139

The method of any one of the preceding method Examples, wherein the third three-dimensional shape has a shape of a load-bearing part as recited in any of Examples 1 to 122.

Example 140

The method of any one of the preceding method Examples, wherein the third three-dimensional shape defines a network of branches as recited in any of Examples 1 to 122.

Example 141

The method of Example 140, wherein the adding step maintains the branches of the network of branches.

Example 142

The method of any one of the preceding method Examples, wherein the third three-dimensional shape meets a target loading requirement of the load-bearing part.

Example 143

The method of any one of the preceding method Examples, wherein the adding step comprises adding the second mass until the third three-dimensional shape meets a target loading requirement of the load-bearing part.

Example 144

The method of any one of the preceding method Examples, comprising modifying the computer model of the third three-dimensional shape to account for three-dimensional printing constraints.

Example 145

A method of forming a part configured to resist deformation under a load, the method comprising:

3D printing a part having the three-dimensional shape obtained by any one of the preceding method Examples.

What is claimed is:

1. A load-bearing part configured to resist a load, the load-bearing part comprising:
    a load-receiving member that defines an outer surface configured to receive a load;
    a support member offset from the load-receiving member along a first direction;
    a network of interconnected branches, the network extending from the load-receiving member to the support member, the network of interconnected branches including:
        at least one primary branch, each having a first primary-branch end attached to one of the load-receiving member and the support member; and
        at least one auxiliary branch, each having a first auxiliary-branch end attached to a first primary branch of the at least one primary branch, and a second auxiliary-branch end attached to one of (i) the load-receiving member, (ii) the support member, and (iii) a second primary branch of the at least one primary branch,
    wherein the first primary-branch end is attached to the load-receiving member and the at least one primary branch has a second primary-branch end that is attached to the support member, and wherein the at least one auxiliary branch comprises a plurality of auxiliary branches, each having a first auxiliary-branch end attached to the first primary branch, and a second auxiliary-branch end attached to the load-receiving member.

2. The load-bearing of claim 1, comprising the second primary branch, spaced from the first primary branch along a second direction, perpendicular to the first direction, the second primary branch having a first primary-branch end attached to the load-receiving member and a second primary-branch end that is attached to the support member.

3. The load-bearing part of claim 2, wherein the second auxiliary-branch end of the at least one auxiliary branch is attached to the second primary branch such that the at least one auxiliary branch extends from the first primary branch to the second primary branch.

4. The load-bearing part of claim 1, wherein the first primary-branch end of the first primary branch is attached to the support member, the second auxiliary-branch end of the at least one auxiliary branch is attached to the load-receiving member, and the first primary branch has a second primary-branch end attached to the first auxiliary-branch end of the at least one auxiliary branch.

5. The load-bearing part of claim 1, wherein the load-bearing part is a three-dimensional printed part.

6. The load-bearing part of claim 1, wherein the network is a monolithic part formed from a single material.

7. The load-bearing part of claim 6, wherein the material comprises Acrylonitrile butadiene styrene (ABS).

8. The load-bearing part of claim 6, wherein the material comprises polyetherimide.

9. The load-bearing part of claim 1, wherein the load-receiving member, the support member, and the network form a monolithic part formed of a single material.

10. The load-bearing part of claim 1, wherein the load-bearing part is formed by additive manufacturing or injection molding.

11. A method of designing a load-bearing part configured to resist a load, the method comprising:
    generating a first computer model of a first three-dimensional shape of the load-bearing part, the first three-dimensional shape having a mass, a load-receiving member outer surface, and a support-member outer surface that is offset from the load-receiving member outer surface along a first direction;

selecting a target mass remaining for a second computer model of a second three-dimensional shape of the load-bearing part;

modifying the first computer model of the first three-dimensional shape so as to define the second computer model of the second three-dimensional shape, wherein the modifying step comprises removing a first mass from first three-dimensional shape between the load-receiving member outer surface and the support-member outer surface, such that the second three-dimensional shape has the target mass remaining; and adding a second mass to the second computer model of the second three-dimensional shape so as to obtain a third computer model of a third three-dimensional shape, wherein the second mass is less than the first mass, wherein the adding step causes the third three-dimensional shape to have a mass greater than the target mass.

12. The method of claim 11, wherein the removing of the first mass is performed so as to maintain a stiffness of the second three-dimensional shape within less than or equal to about ten percent of a maximized stiffness for the target mass.

13. The method of claim 11, wherein the target mass remaining is up to twenty percent of the mass.

14. The method of claim 11, wherein the removing of the first mass is performed so as to maintain a natural frequency of the second three-dimensional shape at the stiffness and target mass to within less than or equal to about ten percent of a maximized natural frequency.

15. The method of claim 14, wherein the removing step is performed so as to maximize natural frequency of the second three-dimensional shape at the stiffness and target mass.

16. The method of claim 11, wherein the removing of the first mass is performed so as to maintain a natural frequency of the second three-dimensional shape at the target mass to within less than or equal to about ten percent of a maximized natural frequency.

17. The method of claim 16, wherein the removing step is performed so as to maximize natural frequency of the second three-dimensional shape at the target mass.

18. The method of claim 11, wherein the target mass remaining in the removing step is up to 30 percent of the mass.

* * * * *